(12) United States Patent
Ishizawa et al.

(10) Patent No.: US 7,740,783 B2
(45) Date of Patent: Jun. 22, 2010

(54) FILM FORMING MOLD, FILM FORMING METHOD USING MOLD, AND FILM FORMING CONTROL SYSTEM

(75) Inventors: Motosuke Ishizawa, Kiryu (JP); Takao Umezawa, Ota (JP)

(73) Assignee: Mitsuba Corporation, Kiryu-shi (JP)

( * ) Notice: Subject to any disclaimer, the term of this patent is extended or adjusted under 35 U.S.C. 154(b) by 1194 days.

(21) Appl. No.: 10/557,784

(22) PCT Filed: May 17, 2004

(86) PCT No.: PCT/JP2004/006981

§ 371 (c)(1), (2), (4) Date: Nov. 18, 2005

(87) PCT Pub. No.: WO2004/101254

PCT Pub. Date: Nov. 25, 2004

(65) Prior Publication Data
US 2007/0029700 A1 Feb. 8, 2007

(30) Foreign Application Priority Data
May 19, 2003 (JP) ............................. 2003-140060

(51) Int. Cl.
  B29C 65/02 (2006.01)
  B29C 33/34 (2006.01)
(52) U.S. Cl. ................... 264/255; 425/95; 425/91; 425/518; 425/134
(58) Field of Classification Search .............. 425/134, 425/518, 95, 91
See application file for complete search history.

(56) References Cited

U.S. PATENT DOCUMENTS

| | | | | |
|---|---|---|---|---|
| 3,462,524 A | * | 8/1969 | Lemelson | 264/255 |
| 4,653,997 A | * | 3/1987 | Sheffield et al. | 425/556 |
| 5,400,317 A | * | 3/1995 | Strasser et al. | 369/275.1 |
| 5,971,732 A | * | 10/1999 | Grisch et al. | 425/98 |
| 6,080,679 A | * | 6/2000 | Suzuki | 438/726 |

(Continued)

FOREIGN PATENT DOCUMENTS

JP   A 61-215020   9/1986

(Continued)

OTHER PUBLICATIONS

Final Rejection mailed Mar. 19, 2010 for U.S. Appl. No. 10/557,475.

*Primary Examiner*—Philip C Tucker
*Assistant Examiner*—Alison Hindenlang
(74) *Attorney, Agent, or Firm*—Oliff & Berridge, PLC

(57) ABSTRACT

When forming a film on a work, such as a lamp holder, the work is not set in a film-forming chamber as in the prior art, but a film is formed thereon by using a mold, thereby simplifying the film formation work. A movable mold is matched to a fixed mold in a state where a vacuum deposition apparatus, the film-forming element, is provided in the fixed mold and the work is supported in the movable mold. Next, film formation is carried out with the film-forming space in a vacuum state. Thereafter, the movable mold is opened, wherein the film formation work on the work surface using molds can be carried out with a series of processes.

20 Claims, 14 Drawing Sheets

U.S. PATENT DOCUMENTS

| | | | |
|---|---|---|---|
| 6,468,458 B1 * | 10/2002 | Anderson et al. | 264/246 |
| 6,506,326 B1 * | 1/2003 | Abbott et al. | 264/104 |
| 2002/0057578 A1 * | 5/2002 | Kageyama et al. | 362/544 |

FOREIGN PATENT DOCUMENTS

| | | |
|---|---|---|
| JP | B2 63-36627 | 7/1988 |
| JP | B2 2-38377 | 8/1990 |
| JP | A 11-162210 | 6/1999 |
| JP | A 11-250702 | 9/1999 |
| JP | A 2002-144370 | 5/2002 |
| WO | WO 0105197 A2 * | 1/2001 |

* cited by examiner

FILM FORMING MOLD, FILM FORMING METHOD USING MOLD, AND FILM FORMING CONTROL SYSTEM

This application is the U.S. National Stage of PCT/JP2004/006981, filed May 17, 2004, which claims priority from JP2003-140060, filed May 19, 2003, the entire disclosures of which are incorporated herein by reference thereto.

Further this application is related to the U.S. National Stage of PCT/JP2004/006979, filed May 17, 2004, U.S. patent application Ser. No. 10/557,475 filed Nov. 18, 2005, the entire disclosure of which is incorporated herein by reference thereto.

BACKGROUND

The disclosure relates to a film forming mold for various types of moldings including headlamps, direction indicators (including side blinkers), tail lamps, etc., which are incorporated in a vehicle, etc., a film forming method using the mold, and a film forming control system.

BACKGROUND ART

Generally, as such a type of molding, there is a molding, such as a lamp body of a headlamp for a vehicle, having a mirror-finished surface being a reflection surface film-formed on the injection-molded molding to increase the light amount and to secure a wider range of irradiation. However, conventionally, a lamp body is produced so that a lamp holder in which a bulb is incorporated and a lens portion formed of resin having transmittance are mold-matched, and the surfaces of the mold-matched portions are adhered together. As such a production method, a mold-slide injection system has been known, for example, refer to Japanese Patent Application No. 62-087315, now Patent Publication No. Hei-2-38377. According thereto, after a lamp holder and a lens portion, which are primary products, are respectively injection-molded in a state where a movable mold and a fixed mold are disposed so as to be opposed to each other, the movable mold is caused to slide, and the respective primary products are mold-matched to be matched to each other. Then, a resin material is secondarily injected to the mold-matched portions of the primary products, thereby integrally molding the lamp body.

SUMMARY

However, such a type of molding cannot cope with a case where a reflection surface is formed on a lamp holder as described above. Therefore, in a case of film-forming the reflection surface, after the lamp holder, injection-molded using a mold, is removed from the mold, a multitude of corresponding removed lamp holders are set in a film-forming chamber, and a reflection surface is formed on the inner surfaces of the corresponding multitude of moldings by using forming means, such as a vacuum deposition apparatus or a spattering apparatus. Thereafter, the lamp holder and lens portion are made integral with each other.

However, because the film-forming chamber is provided to form films with a multitude of moldings set therein in order to increase efficiency, the area of the chamber is caused to be larger. As a result, it not only takes more time to form a vacuum in the entire film-forming chamber, but also it is necessary to form a vacuum more completely because there is a long distance between a molded lamp holder and film-forming means. Therefore, there is a problem in that work efficiency is worse.

Furthermore, in a case where it is necessary to form a vacuum in the film-forming space for film formation, because an opening/closing means is provided at the side of a vacuum pump, the cubic volume ranging from the opening/closing means to the film-forming space is enlarged, and the time required for forming a vacuum in the film-forming space is lengthened. Therefore, there is another problem in that work efficiency is further worsened.

Still further, where film-forming work is carried out using a mold which is not available in the prior art, where a vacuum is formed in the film-forming space, and atmospheric air is caused to flow in the film-forming space when opening the mold, there remains a question as to quickness of work and improvement in work efficiency. However, in the prior art, there has been no case where such matters are taken into consideration.

The following was developed to solve such problems in view of the above-described situations.

A first aspect of the disclosure is a film-forming mold composed of a first mold in which a work on which a film is formed is incorporated, and a second mold in which a film-forming means, to form a film on the work, is incorporated.

A second aspect of the disclosure is a film-forming mold wherein, in addition to the first aspect, the second mold is a mold for molding a work.

A third aspect of the disclosure is a film-forming mold wherein, in addition to the first or the second aspects, the first mold is a movable type and the second mold is a fixed type.

A fourth aspect of the disclosure is a film-forming mold wherein, in addition to any one of the first aspect through the third aspect, the film-forming means is a spattering apparatus or a vacuum deposition apparatus.

A fifth aspect of the disclosure is a film-forming mold wherein, in addition to any one of the first aspect through the fourth aspect, the film-molding means is provided in a cylindrical recessed hole having a bottom, which is formed in the second mold, and a film-forming space is secured between the film-forming means and the work.

A sixth aspect of the disclosure is a film-forming mold wherein, in addition to any one of the first aspect through the fourth aspect, the film-forming means is provided so as to airtightly seal a through-hole provided in the second mold, and a film-forming space is secured between the film-forming means and the work.

A seventh aspect of the disclosure is a film-forming mold wherein, in addition to any one of the first aspect through the sixth aspect, the second mold is provided with a vacuuming flow channel to make the film-forming space vacuum, and a first opening/closing means for opening and closing the vacuuming flow channel.

An eighth aspect of the disclosure is a film-forming mold wherein, in addition to any one of the first aspect through the seventh aspect, the second mold includes a masking portion for masking a work attached to the first mold.

A ninth aspect of the disclosure is a film-forming mold wherein, in addition to any one of the first aspect through the eighth aspect, the first mold or the second mold is provided with an atmospheric air inlet channel for permitting atmospheric air to flow into the film-forming space, and a second opening/closing means for opening and closing the atmospheric air inlet channel.

A tenth aspect of the disclosure is a film-forming mold wherein, in addition to the ninth aspect, the atmospheric air inlet channel and the second opening/closing means are provided in an ejector means for removing a film-formed work from the first mold.

An eleventh aspect of the disclosure is a film-forming mold wherein, in addition to the ninth aspect or the tenth aspect, the second mold is provided with a third opening/closing means for opening and closing a film-forming space, which is positioned between the vacuuming flow channel and the atmospheric air inflow channel.

A twelfth aspect of the disclosure is a film-forming method using a mold, which comprises, at least, the sequential steps of mold matching of a first mold in which a work on which a film is formed is incorporated and a second mold in which film-forming means to form a film on the work is incorporated; film-forming for forming a film on a work; and opening the first mold and the second mold.

A thirteenth aspect of the disclosure is featured, in addition to the twelfth aspect, in a film-forming method using a mold in which the first mold is a movable type and the second mold is a fixed type.

A fourteenth aspect of the disclosure is featured, in addition to the twelfth aspect or the thirteenth aspect, in a film-forming method using a mold, wherein the film-forming means is a spattering apparatus or a vacuum deposition apparatus.

A fifteenth aspect of the disclosure is featured, in addition to the twelfth aspect through the fourteenth aspect, in a film-forming method using a mold, wherein a vacuuming step to make a vacuum in a film-forming space between the film-forming means and a work is provided between the mold-matching step and the film-forming step.

A sixteenth aspect of the disclosure is featured, in addition to the fifteenth aspect, in a film-forming method using a mold, wherein the second mold is provided with a vacuuming flow channel communicating with a vacuum pump to make the film-forming space a vacuum, and first opening/closing means for opening and closing the vacuuming flow channel, and the vacuuming step is carried out by opening the first opening/closing means.

A seventeenth aspect of the disclosure is featured, in addition to any one of the twelfth aspect through the sixteenth aspect, in a film-forming method using a mold, wherein the second mold is provided with a masking portion for masking a work attached to the first mold, and the work is masked in the mold-matching step.

An eighteenth aspect of the disclosure is featured, in addition to the sixteenth aspect or the seventeenth aspect, in a film-forming method using a mold, wherein the first mold or the second mold is provided with an atmospheric air inflow channel for causing atmospheric air to flow into the film-forming space, and second opening/closing means for opening and closing the atmospheric air inflow channel, and a first opening/closing means closing step for closing the first opening/closing means and a second opening/closing means opening step for opening the second opening/closing means are provided between the film-forming step and the mold-matching step.

A nineteenth aspect of the disclosure is featured, in addition to the eighteenth aspect, in a film-forming method using a mold, wherein the atmospheric air inflow channel and the second opening/closing means are provided in an ejector means for removing a film-formed work from the first mold, and the second opening/closing means opening step is carried out in line with removal of the work by the ejector means.

A twentieth aspect of the disclosure is featured, in addition to the eighteenth aspect, in a film-forming method using a mold, wherein the atmospheric air inflow channel is a mold-matching surface between the first mold and the second mold, and the second opening/closing means closes the atmospheric air inflow channel by mold matching in the mold-matching step, and opens the atmospheric air inflow channel in the mold-opening step.

A twenty-first aspect of the disclosure is featured, in addition to any one of the sixteenth aspect through the twentieth aspect, in a film-forming method using a mold, wherein the second mold is provided with a third opening/closing means for opening and closing a film-forming space between the vacuuming flow channel and the second opening/closing means, and a third opening/closing means closing step for closing the third opening/closing means is provided during the steps from the end of the film-forming step to the second opening and closing opening step.

A twenty-second aspect of the disclosure is featured in a film-forming method using a mold which comprises a first mold in which a work on which a film is formed is incorporated; a second mold in which film-forming means for molding a film on the work in a vacuum state; a vacuuming flow channel for making a vacuum of a film-forming space between the film-forming means and the work; a first opening/closing means for opening and closing the vacuuming flow channel; and a second opening/closing means for opening and closing the film-forming space for communication with the atmosphere; and the same method comprises the steps of mold-matching the first mold in which the work is incorporated and the second mold; making a vacuum of the film-forming space in a state where the second opening/closing means is closed and the first opening/closing means is opened; film-forming by film-forming means in a state where the first opening/closing means is opened or closed and the second opening/closing means is closed; causing atmospheric air to flow into the film-forming space in a state where the first opening/closing means is opened or closed and the second opening/closing means is opened; and opening the mold-matched molds.

A twenty-third aspect of the disclosure is featured in a film-forming method using a mold which comprises a first mold in which a work on which a film is formed is incorporated; a second mold in which film-forming means for forming a film on the work in a vacuum state; a vacuuming flow channel for making a vacuum of a film-forming space between the film-forming means and the work; a first opening/closing means for opening and closing the vacuuming flow channel; a second opening/closing means for opening and closing the film-forming space for communication with the atmosphere; and a third opening/closing means for opening and closing a film-forming space between the vacuum flow channel and the second opening/closing means; and the same method comprises the steps of mold-matching the first mold in which the work is incorporated and the second mold; making the vacuum in the film-forming space in a state where the second opening/closing means is closed and the first and the second opening/closing means are opened; film-forming by film-forming means in a state where the first opening/closing means is opened or closed, the second opening/closing means is closed, and the third opening/closing means is closed; causing atmospheric air to flow into a space of the film-forming space nearer to the work side than the third opening/closing means by opening the second opening/closing means in a state where the first opening/closing means is opened or closed; and opening the mold-matched molds.

A twenty-fourth aspect of the disclosure is featured in a film-formation controlling system using a mold, comprising a means for forming a film in a vacuum state; a means for actuating a mold for mold matching and opening of a first mold in which a work on which a film is formed is incorporated and a second mold in which the film-forming means is incorporated; and a first opening/closing means for opening and closing a vacuuming flow channel to make a vacuum in a film-forming space between the film-forming means and the work; and simultaneously including a control portion, the control of which is established to sequentially carry out an output of a mold-matching operation command to the mold-matching means; an output of an opening operation command to the first opening/closing means; an output of a film-forming operation command to the film-forming means; an output of a film formation stopping command to the film-forming means; an output of a closing operation command to the first opening/closing means; and an output of a mold-opening operation command to the mold actuating means.

A twenty-fifth aspect of the disclosure is featured in a film-formation controlling system using a mold, comprising a means for forming a film in a vacuum state; a means for actuating a mold for mold matching and opening of a first mold in which a work on which a film is formed is incorporated and a second mold in which the film-forming means is incorporated, and for opening the molds; and a first opening/closing means for opening and closing a vacuuming flow channel to make a vacuum of a film-forming space between the film-forming means and the work; and simultaneously including a control portion the control of which is established to sequentially carry out an output of a mold-actuating operation command to the mold-matching means; an output of an opening operation command to the first opening/closing means; an output of a closing operation command to the first opening/closing means; an output of a film-forming operation command to the film-forming means; an output of a film formation stopping command to the film-forming means; and an output of a mold opening operation command to the mold actuating means.

A twenty-sixth aspect of the disclosure is featured, in addition to any one of the twenty-third aspect through the twenty-fifth aspect, in a film-formation controlling system using a mold, comprising an atmospheric air flow channel for causing atmospheric air to flow into the film-forming space and a second opening/closing means for opening and closing the atmospheric flow channel, wherein the control portion is established to control so that an opening operation command is outputted to the second opening/closing means simultaneously with or prior to the output of the mold opening operation command.

A twenty-seventh aspect of the disclosure is featured, in addition to the twenty-sixth aspect, in a film-formation controlling system using a mold, wherein a third opening/closing means for opening and closing a film-forming space between the vacuuming flow channel and the second opening/closing means is provided, and the control portion is established to control so that a closing operation command is outputted to the third opening/closing means simultaneously with or prior to the output of an opening operation command to the first opening/closing means, and an opening operation command is outputted to the third opening/closing means simultaneously with or prior to the output of a mold-opening operation command to the mold-actuating means.

According to the first aspect, it is possible to simply form a film on a work by using the first mold and the second mold.

According to the second aspect, because molds for molding a work can be effectively used to form a film on the work, and at the same time, a film is formed successively to molding the work, film formation can be carried out in a state where no fingerprints are attached to the surface of the work or there is no case where the work is brought into contact with other members and is damaged.

According to the third aspect, because the second mold in which film-forming means is incorporated is a fixed mold, members derived from the film-forming means, such as lead wires and piping led from (connected to) the film-forming means can be made stationary (immovable) when molding by the mold. Therefore, such members can be freed from repeated strain based on repeated folding and bending.

According to the fourth aspect, spattering and vacuum deposition can be carried out.

According to the fifth aspect, incorporation of film-forming means in the second mold can be carried out from the mold-matching surface side.

According to the sixth aspect, incorporation of film-forming means in the second mold can be carried out from the side opposite the mold-matching surface side.

According to the seventh aspect, because the second mold is provided with a vacuuming flow channel and first opening/closing means for opening and closing the vacuuming flow channel, the second mold can be simplified, and at the same time, the cubic volume at the film-forming space side from the first opening/closing means can be made smaller than in a case where the first opening/closing means is provided at the vacuum pump side, wherein the time required for securing a vacuum state can be shortened, and work efficiency can be improved.

According to the eighth aspect, masking of a work can be carried out by effectively using the second mold in which film-forming means is provided.

According to the ninth aspect, because the molds can be opened in a state where atmospheric air flows into the vacuumed film-forming space, the molds can be smoothly and gently opened.

According to the tenth aspect, inflow of atmospheric air can be carried out by effectively using ejector means secured to remove a film-formed work from the first mold.

According to the eleventh aspect, it is possible that the film-forming means side of the film-forming space from the third opening/closing means between the vacuuming flow channel of the film-forming space and the atmospheric air flow channel can be maintained in a vacuum state.

According to the twelfth aspect, it becomes possible to form a film by using a mold for a work.

According to the thirteenth aspect, because the second mold in which the film-forming means is incorporated is a fixed mold, and members derived from (connected to) the film-forming means, such as lead wires and piping, etc., are not brought into contact with the molding molds and can be made stationary (immovable), the members can be freed from any repeated strain generated due to repeated folding and bending.

According to the fourteenth aspect, spattering and vacuum deposition may be applicable.

According to the fifteenth aspect, vacuuming can be easily achieved in a film-forming space when spattering and vacuum deposition are carried out.

According to the sixteenth aspect, the vacuuming flow channel secured in the second mold can be opened and closed by the first opening/closing means, wherein the second mold can be simplified, and at the same time, the cubic volume at the film-forming space from the first opening/closing means can be made smaller than in the case where the first opening/closing means is provided at the vacuum pump side. And, the time required for vacuuming can be shortened, and work efficiency can be improved.

According to the seventeenth aspect, masking of a work can be carried out by effectively using the second mold in which film-forming means is incorporated.

According to the eighteenth aspect, because the film-forming space, which is under vacuum conditions when forming a film, is opened with atmospheric air flowing in, the mold can be smoothly and gently opened.

According to the nineteenth aspect, atmospheric air can flow in by effectively using the ejector means provided to remove a film-formed work from the first mold.

According to the twentieth aspect, it is possible to cause atmospheric air to flow into the film-forming space that is under a vacuumed condition, without forming an exclusive atmospheric air flow channel and any second opening/closing means.

According to the twenty-first aspect, it is possible that the film-forming means side of the film-forming space from the third opening/closing means, between the vacuuming flow channel of the film-forming space and the atmospheric air flow channel, can be maintained in a vacuum state.

According to the twenty-second aspect and the twenty-third aspect, a series of film-forming processes of a work, in which a film is formed with the film-forming space in a vacuum condition, can be continuously carried out.

According to the twenty-fourth aspect and the twenty-fifth aspect, film formation on a work can be automatically carried out by using the control portion.

According to the twenty-sixth aspect, inflow of atmospheric air into the vacuum state film-forming space can be automatically controlled while opening the mold after a film is formed.

According to the twenty-seventh aspect, the space at the film-forming means side of the film-forming space from the third opening/closing means can be automatically controlled so that the space can be maintained in a vacuum state with the mold opened.

BRIEF DESCRIPTION OF THE DRAWINGS

The disclosure will be made with reference to the drawings in which.

DETAILED DESCRIPTION OF EMBODIMENTS

Figure 1:
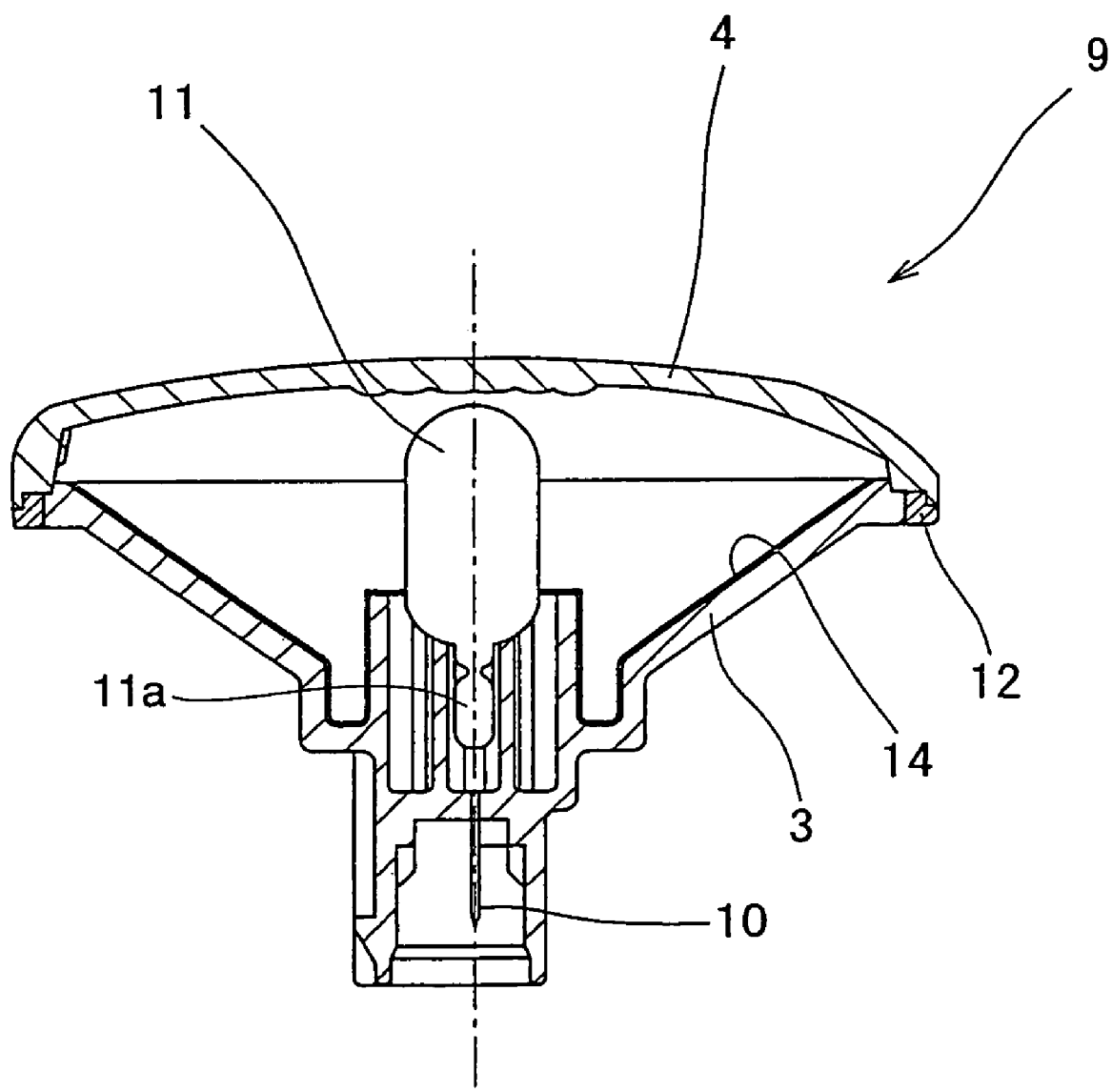
FIG. 1 is a longitudinal, cross-sectional view showing a side direction indicator (side blinker)
Figure 2:
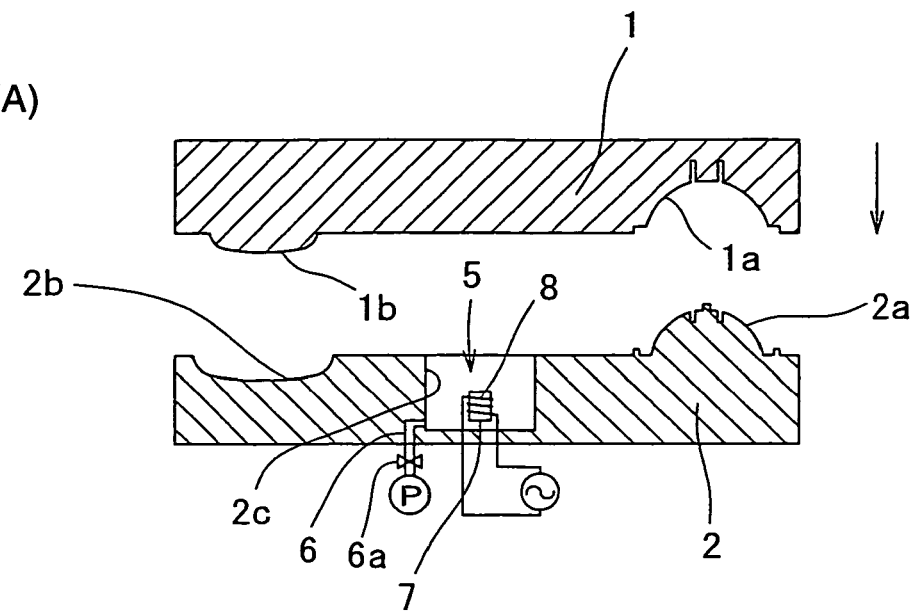
FIGS. 2(A) through 2(C) are schematic, cross-sectional views showing the processes of the primary injection.
Figure 2:
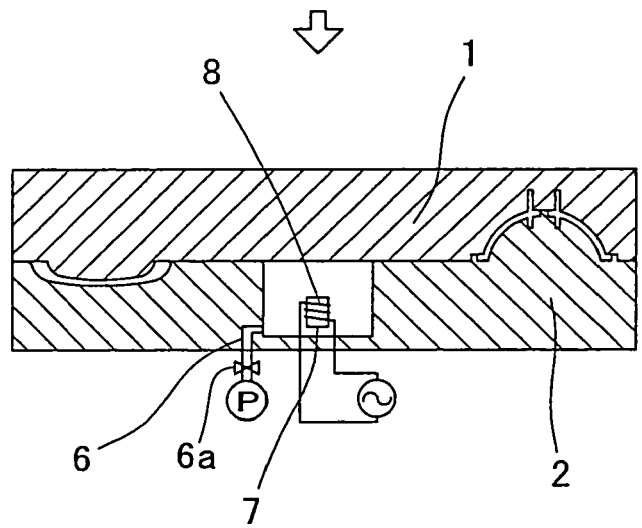
Figure 2:
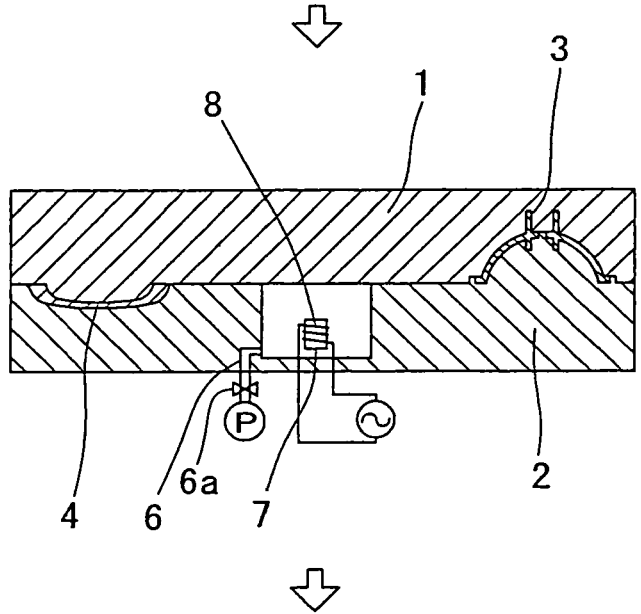
Figure 3:
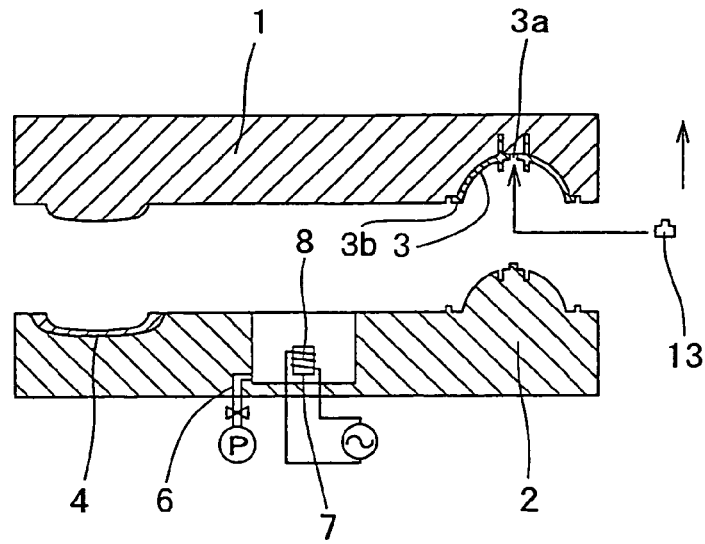
FIGS. 3(A) through 3(C) are schematic, cross-sectional views showing the processes of the secondary mold matching.
Figure 3:
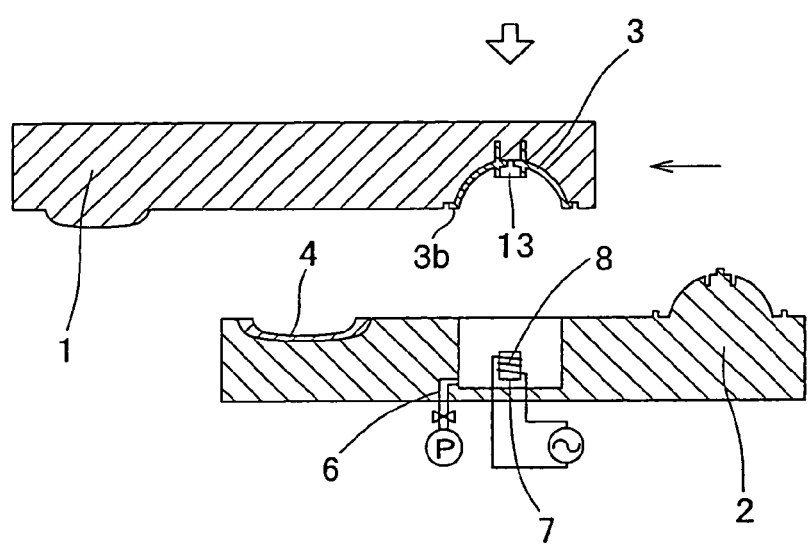
Figure 3:
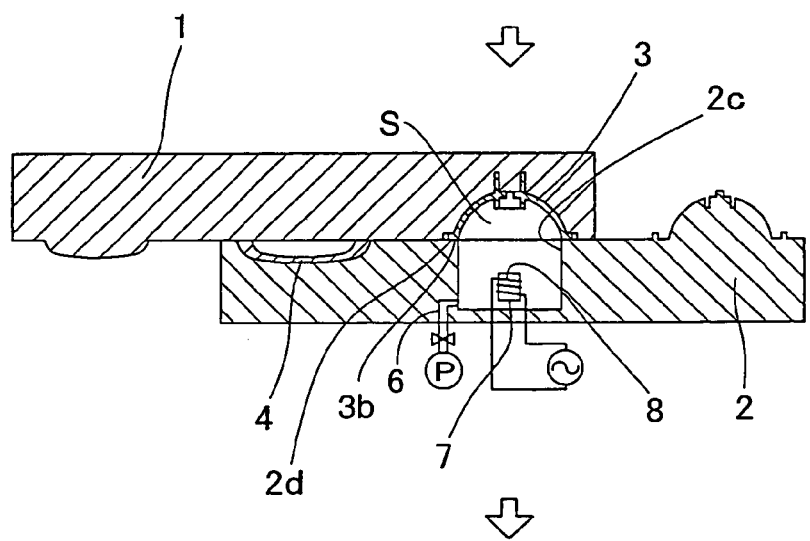
Figure 4:
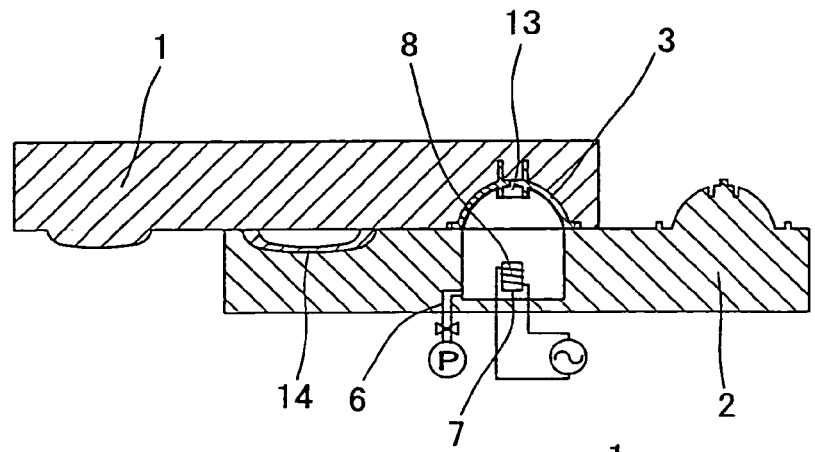
FIGS. 4(A) through 4(C) are schematic, cross-sectional views showing the processes to add a lamp holder to a lens portion.
Figure 4:
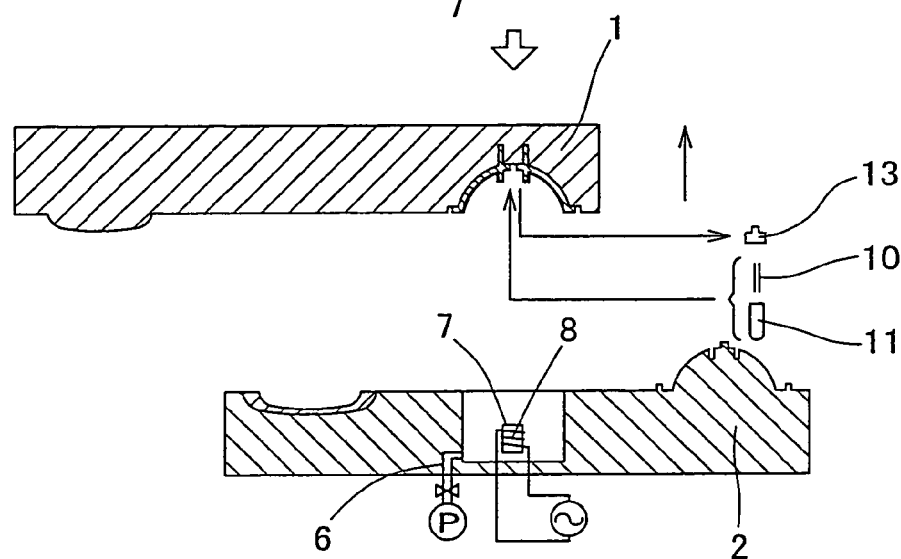
Figure 4:
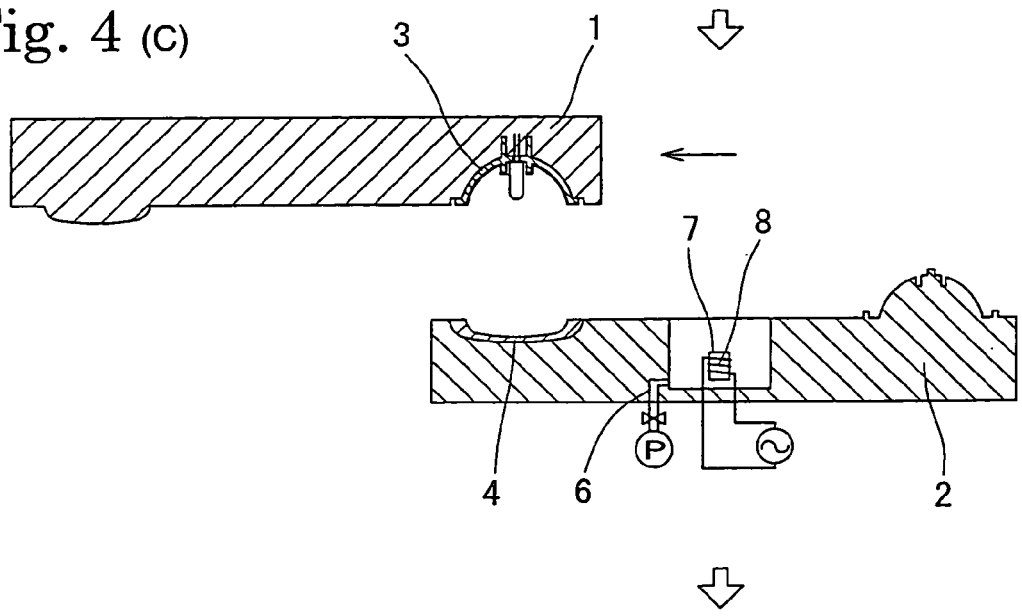
Figure 5:
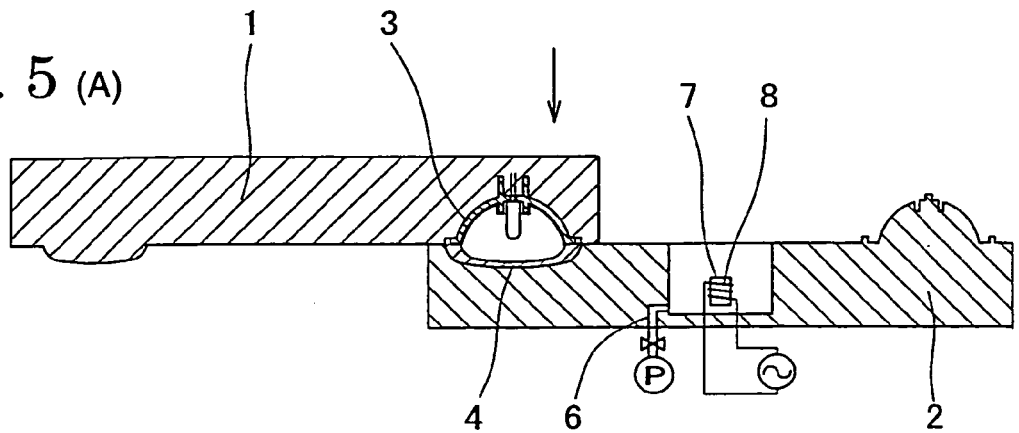
FIGS. 5(A) through 5(C) are schematic, cross-sectional views showing the processes for removal of a lamp body.
Figure 5:
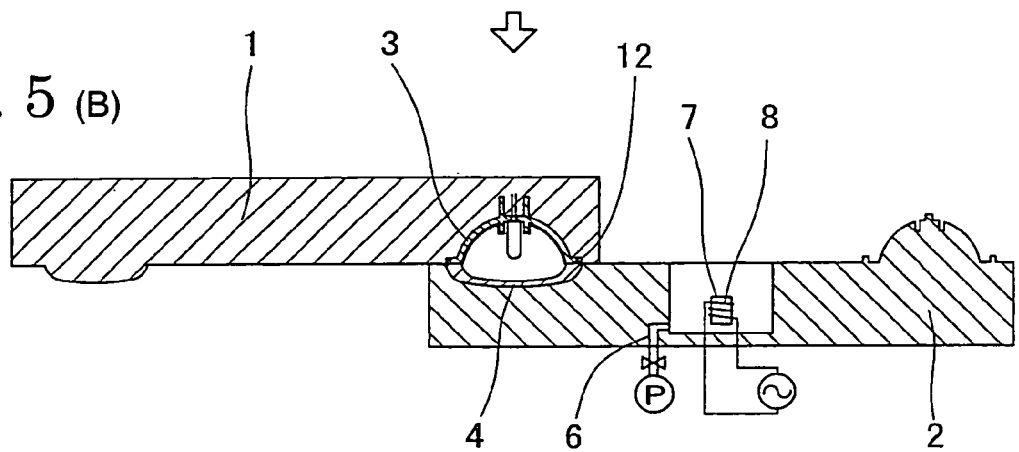
Figure 5:
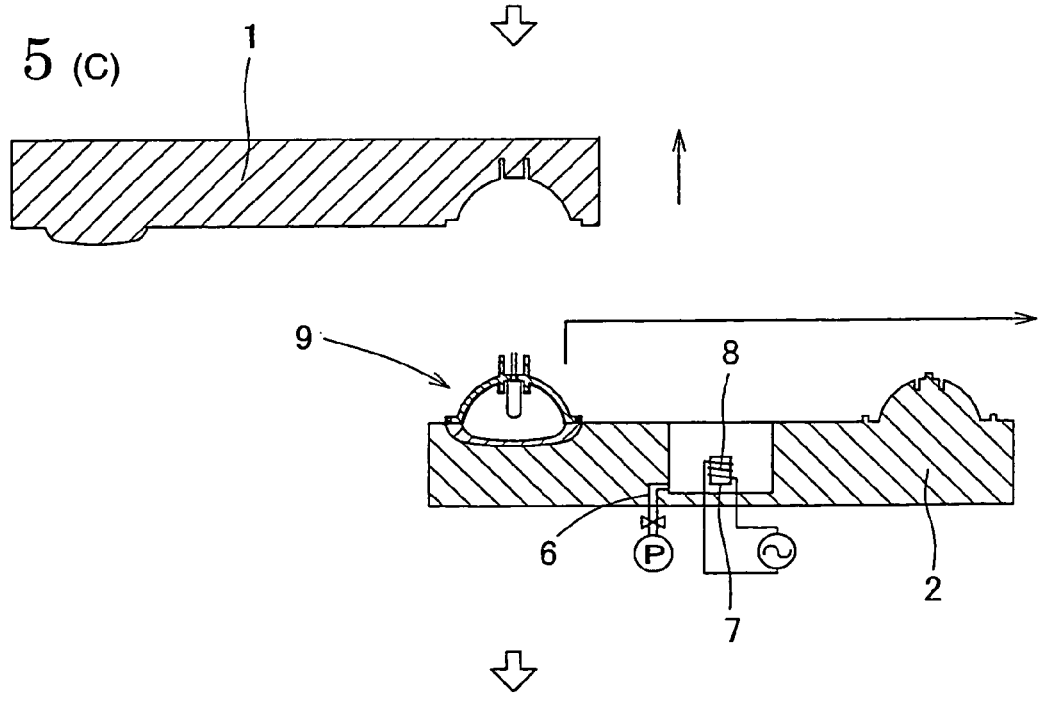
Figure 6:
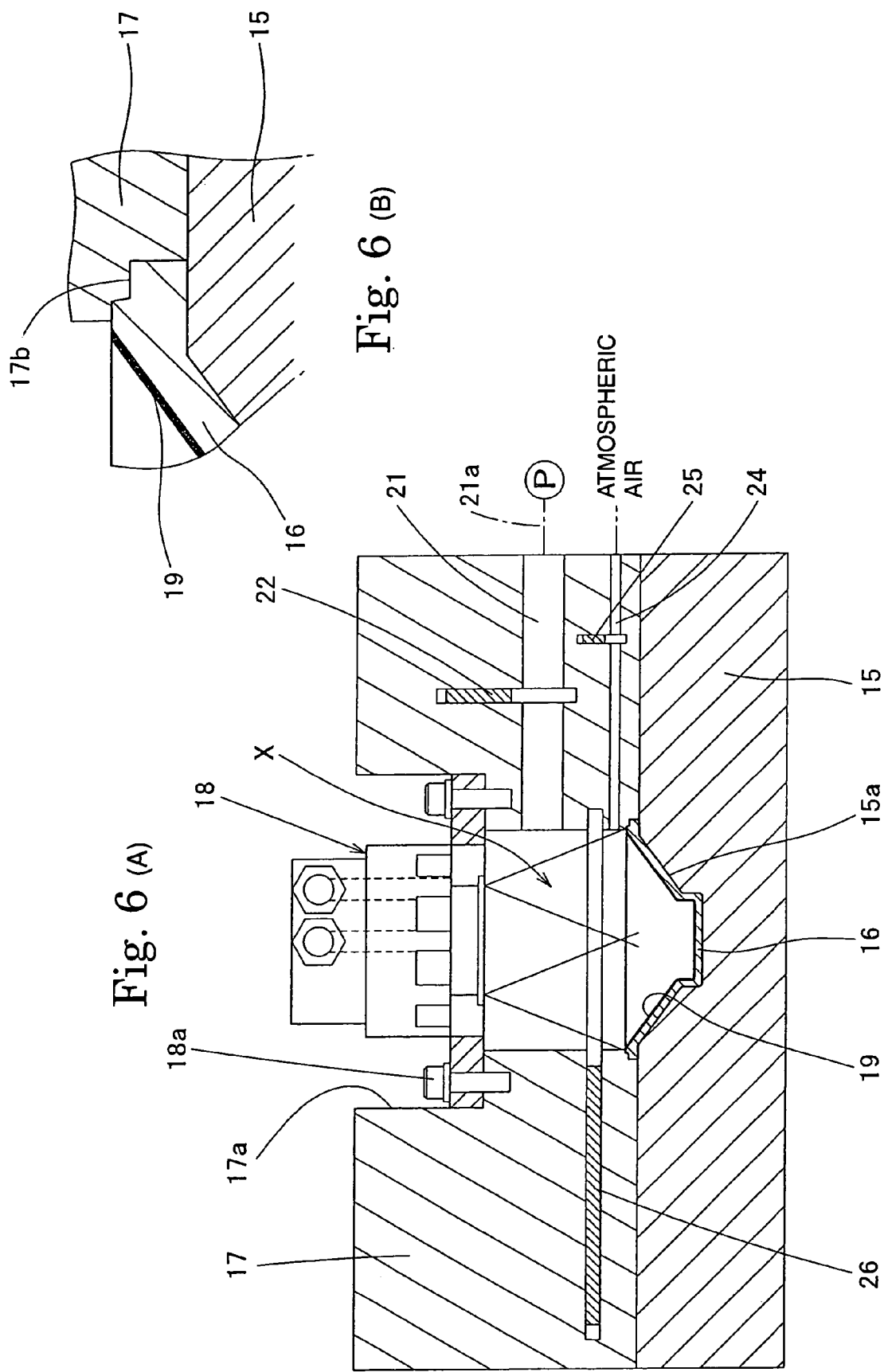
FIGS. 6(A) and 6(B) are schematic, cross-sectional views showing a mold portion according to a second embodiment.

Next, a description is given of a first exemplary embodiment with reference to FIGS. 1 through 5. In the drawings, reference number 1 denotes a movable mold (the first mold), and 2 denotes a fixed mold (the second mold). The movable mold 1 is movable (to be separated from and contacted to) in opposite directions with respect to the second mold 2 and is also structured to be movable in the direction along the face of the fixed mold 2 (parallel or lateral movement) in a state apart from the fixed mold 2. However, as technology used for prior art mold slide injection can be employed, as it is, for the detailed movement mechanism, a detailed description thereof is omitted. Also, because movement of the molds may be relative to each other, it may be such that the first mold is fixed and the second mold is movable. Further, it is a matter of course that both the molds are structured to make relative movement. In addition, if the movement is movement in the direction along the facial region, the movement may not only be parallel movement in the linear direction but also rotating movement centering around an axis. Examples of movement control of the molds 1, 2 will be described later.

Formed in the movable mold 1 are a concave mold surface 1a, for forming the outside face of a lamp holder 3 (corresponding to a "work" of the invention), and a convex mold surface 1b, for forming the inside face of a lens portion 4. A convex mold surface 2a, for forming the inside face of the lamp holder 3, and a concave mold surface 2b, for forming the outside face of the lens portion 4, are formed in the fixed mold 2. Further, a concave mold surface 2c is formed in the fixed mold 2, as film-forming means. The mold surface 2c accommodates (internally includes) a vacuum deposition apparatus 5 as employed in the present embodiment. The concave mold surface 2c is formed between the convex mold surface 2a, for forming the inside face of the lamp holder 3, and the concave mold surface 2b, for forming the outside face of the lens portion 4. Although a publicly known vacuum deposition apparatus 5 is employed, the vacuum deposition apparatus 5 is briefly described. The vacuum deposition apparatus 5 is provided with a vacuuming flow channel 6 connected to a vacuum pump P via the first opening/closing valve 6a, a boat (target) 7 in which metal (for example, aluminum and chromium) to be deposited is accommodated, and a heater 8 for heating the boat 7.

A lamp body 9 is a side blinker in this described exemplary embodiment. A terminal 10 and a bulb 11 are incorporated therein as necessary components. The lamp body 9 is composed of the lamp holder 3, molded with a non-translucent resin material, and a lens portion 4, molded with a translucent resin material. As described later, after the lamp holder 3 and the lens portion 4 are molded by the primary injection molding process, the movable mold 1 is moved (mold-slid), wherein the lamp holder 3 and the lens portion 4 are mold-matched. A resin material 12 is then secondarily injection-molded along the mold-matched face portions so the components are integrated to produce the lamp body 9.

A method for producing the lamp body 9 will now be described with reference to the drawings. FIG. 2(A) shows that, with respect to both the molds 1, 2, the mold surfaces 1a, 2a for forming the lamp holder 3, and the mold surfaces 1b, 2b for forming the lens portion 4 are opposed to each other in a state spaced from each other (that is, with the molds opened).

The movable mold 1 is moved to the fixed mold 2 side from the state of being spaced from each other, and the mold surfaces opposing each other are mold-matched (primary mold-matching process: Refer to FIG. 2(B)). In the mold-matched state, primary injection molding is carried out, wherein the lamp holder 3 and the lens portion 4 are injection-molded, respectively (primary injection molding process: Refer to FIG. 2(C)).

Thereafter, as shown in FIG. 3(A), a mold releasing (mold-opening) process, in which the movable mold 1 is moved in the direction such that the movable mold 1 is released, or opened, from the fixed mold 2. At this time, the molds are designed so that the lamp holder 3 is supported (remains) in the movable mold 1 without being released, and the lens portion 4 is supported (remains) in the fixed mold 2 side without being released. Next, after the movable mold 1 moves laterally (refer to FIG. 3(B)) so that the lamp holder 3 is opposed to the vacuum deposition apparatus 5, the movable mold 1 moves to the fixed mold 2 side and is mold-matched (secondary mold-matching process: Refer to FIG. 3(C)), and a film-forming space S, formed between the interior of the concave mold surface 2c and the lamp holder 3 opposed thereto, is sealed from the atmosphere.

In a state where both of the molds 1, 2 are apart from each other before or after making the parallel, or lateral, movement, a masking, or covering, member 13 for masking (covering) portions that are not to be vacuum-deposited, that is, portions for receiving both the terminal 10 and an insertion portion 11a of the bulb 11, that are part of the lamp holder 3 (masking member incorporating process). The masking member incorporating process is then carried out. In the embodiment, the masking member 13 is incorporated at a stage before making parallel movement. Also, the molds are designed so that the peripheral portion 2d, at the opening side of the concave mold surface 2c that internally includes the vacuum deposition apparatus 5, masks the mold-matching surface 3b, that attaches the lamp holder 3 to the lens portion 4, and the mold-matching surface 3b is not vacuum-deposited.

After the sealed film-forming space S is formed in a mold-matched state where the lamp holder 3 and the vacuum deposition apparatus 5 are opposed to each other, the first opening/closing valve 6a is opened, air in the film-forming space S is removed from the vacuum flow path 6 to cause the interior of the film-forming space S to become a vacuum. In this state, molten metal supplied to the boat 7 is evaporated by the heater 8, wherein the metal is vacuum-deposited on an exposed inner surface of the lamp holder 3, and a reflection surface 14 is film-molded film, or reflection surface, forming process of FIG. 4(A)). Next, after the film is formed, the movable mold 1 is released (mold-opened) from the fixed mold 2 (FIG. 4(B)). Thereafter, the movable mold 1 is moved in parallel to the fixed mold 2 to cause the lamp holder 3 and the lens portion 4 to be opposed to each other (FIG. 4(C)). In this connection, before and after moving the movable mold 1 in parallel, a process for removing the masking member 13 and a process for incorporating the terminal 10 and the bulb 11, as necessary components, are carried out. In the embodiment, in the process where a mold-releasing step is finished before making parallel movement, the above-described removing process and incorporating process are carried out. In addition, although the film-forming space S is a vacuum, the molds are opened by an operation force of a mold-opening action of the movable mold 1 because the film-forming space S is small, wherein atmospheric air is caused to flow into the film-forming space S.

After that, the movable mold 1 is moved to the fixed mold 2, and the lamp holder 3 and the lens portion 4 are mold-matched (third mold-matching process of FIG. 5(A)). A resin material 12 is secondarily injected to the mold-matched surface between the lamp holder 3 and the lens portion 4 (secondary injection molding process of FIG. 5(B)), whereby the lamp holder 3 and the lens portion 4 are integrated, and a lamp body 9 having a reflection surface 14 formed thereon is formed. Then, the movable mold 1 is spaced from the fixed mold 2, and the molded lamp body 9 is removed (released from the mold; FIG. 5(C)). After that, the movable mold 1 moves in parallel to the initial position of FIG. 2(A). Subsequently, the process is repeated.

In the just described embodiment, when producing the lamp body 9, because a film-forming process for forming a reflection surface 14 on the inner surface of the lamp holder 3 is provided between the primary injection molding process for forming the lamp holder 3 and the lens portion 4 and the secondary injection molding process for integrating the lamp holder 3 and the lens portion 4, any work for removing the lamp holder 3 and resetting the same is no longer required as it was in the prior art. In the prior art it was also necessary that, after a reflection surface was formed on the lamp holder 3 once removed from the mold, the lamp holder 3 needed to be set in the mold again thereafter. However, in the embodiment, it is possible to produce the lamp holder 3 and to form a film for the reflection surface in a series of mold sliding processes, wherein work efficiency can be improved. Furthermore, because it is not necessary that the lamp holder 3 be removed and reset, there is no case where fingerprints can adhere to the reflection surface 14 by touching the same or that the reflection surface is damaged due to being brought into contact with any other materials, wherein the generation of defects can be reduced to a large extent.

Still further, in the embodiment, in the film-forming process, the outer surface of the lamp holder 3 (that is, the surface covered by the first mold 1) is supported, as it is, in the movable mold 1 without being released therefrom, that is, is completely hidden from the outside, wherein the first mold 1 itself functions as a masking member with respect to the outer surface of the lamp holder 3 (the surface when the lamp holder is made into a final product), and there is no case where any film is formed on the outer surface of the lamp holder 3. Furthermore, in this case, because the concave mold surface 2c in which the vacuum deposition apparatus 5 body is accommodated is formed on the second mold 2, that is a fixed mold, the vacuum deposition apparatus 5 is fixed, wherein, as in the case where the vacuum deposition apparatus 1 is installed in the movable mold 1 side, it is not necessary to employ a structure for which movement of pump piping and wiring must be taken into consideration. Therefore, the structure is simplified along with improved durability.

Still further, in the embodiment, because, if a reflection surface of metal film is formed on portions where the reflection surface is not desired to be formed, that is, on the portions where the terminal 10 and the bulb 11 are attached, insulation is, spoiled and circuits are shorted, those portions are filled by the masking member 13, and the reflection surface 14 is formed. Therefore, a lamp body 9 that is free from any problem of short-circuiting can be produced. Furthermore, in the embodiment, because the terminal 10 and the bulb 11 are incorporated after removing the masking member 13 after the reflection surface 14 is formed, all the production work, including film formation, can be smoothly carried out in a series of mold-sliding processes. As a result, it is possible to efficiently produce the lamp body 9.

Still further, although the lamp body 9 is structured so that the mold-matching portion between the lamp holder 3 and the lens portion 4 are cemented, or adhered, together in the secondary injection molding process, when forming a film in the lamp holder 3, the cementing portion 3b is masked by the peripheral portion 2d at the opening side of the concave mold surface 2c in which the vacuum deposition apparatus 5 body is accommodated. Therefore, there is no case where a film is formed on the cementing portion 3b. As a result, it is not necessary to use any exclusive masking member 13 with respect to masking the cementing portion 3b with the lamp holder 3 held in the first mold 1, as the cementing portion 3b is masked by using the second mold 2. Thus, there is no case where a film is formed on the portion molded in the secondary injection molding process, and the lamp holder 3 and the lens portion 4 can be securely adhered to each other, wherein work efficiency can be increased.

Also, because the concave mold surface 2c for accommodating the vacuum deposition apparatus 5 body, which is formed in the fixed mold 2, is disposed between the mold surfaces 2a, 2b on which the lamp holder 3 and the lens portion 4 are formed, the direction along which the movable mold 1 moves from the primary injection molding process to the reflection surface forming process becomes identical to the direction along which the movable mold 1 moves from the reflection surface forming process to the secondary injection molding process. As a result, there is an advantage in that the structure of the mold-sliding mechanism can be simplified.

In addition, the disclosure is not limited to the above-described embodiment, and the film formation is not limited to a reflection surface, such as a mirror-like surface, but it may be film formation based on painting, etc. Furthermore, the film-forming means is not limited to an vacuum deposition apparatus. Various types of known film-forming apparatuses may be employed, in which a physical vapor deposition method (PVD) such as spattering deposition, etc., a chemical vapor deposition method (CVD) such as thermal deposition and plasma deposition, etc., are available. In addition, in the case of a molding such as a lamp holder, the molding may be made into such a type in which accessories such as a terminal and a bulb, etc., are installed after molding. Further, in the film-forming means, the color of a film formed may be varied based on a type of metal (for example, copper, aluminum, nickel, etc.) being a target, the degree of vacuum and the type of filling gas.

Also, although the embodiment is produced by injection molding as a molding process, the process is not limited to such molding process. It may be embodied in a commonly known molding technique, such as, for example, press molding, blow molding, etc. Still further, if, for instance, a description is given of a case where the final product is a completed lamp body, the disclosure is applicable to a case where the lamp body is not continuously molded to the end as in the present embodiment, rather an intermediate product in which a mirror-like surface 14 is formed on the lamp holder 3 is molded, and the molding is released from a mold and is used as a component. Also, the film-forming means may be not only provided in the same mold as the mold for forming a surface which becomes a mirror-like surface, but also provided in a different mold.

In addition, with respect to the mold, an example in which two molds comprising the first mold and the second mold are employed was described in the above-described embodiment. Where a molding has a complicated shape, which cannot be molded using only two molds, it is possible to increase the number of molds as necessary, for example, a third mold, a fourth mold, etc. In this case, it is a matter of course that the invention can be embodied if the invention is structured so that masking is carried out with at least one of the molds.

Furthermore, a description is given of a second embodiment with reference to FIGS. 6 through 10. The second embodiment is such that a film surface 19 is formed on an exposed surface of a work (molding) 16 incorporated in the first mold 15, which is a movable mold, using a spattering apparatus 18 incorporated in the second mold 17, which is a fixed mold. A description is concurrently given of control procedures therefore.

While a mold surface 15a for incorporating and supporting a work 16 is formed in the first mold 15, a through-hole 17a for incorporating the spattering apparatus 18, which employs an argon gas as an inactive gas, is drilled in the second mold 17. The spattering apparatus 18, inserted from the outside of the through-hole 17a, is sealably attached to the second mold 17 via tightening bolts 18a. In this case, the first mold 15 molds the work (lamp holder) 16 as in the first mold 1 according to the first embodiment, and the mold surface 15a may be formed as in the case of the mold surface 1a of the first embodiment. The first mold 15 is set so as to be tightened and released, wherein an actuator, such as a hydraulic cylinder, may be used as an operation actuator 20.

On the other hand, a film-forming space X is formed between the spattering apparatus 18 and the work 16 in a state where the first mold 15 and the second mold 17 are matched to each other. A cylindrical vacuuming flow channel 21, communicating with and connected to a vacuum pump p is drilled in the second mold 17 nearer than the spattering apparatus 18 to the work 16 side. Further, in the second mold 17, the first opening/closing valve (corresponding to the first opening/closing means of the invention) 22 is provided to open and close the vacuuming flow channel 21. The first opening/closing valve 22 may be an electromagnetic valve, a hydraulic pilot valve, or any universal valve in the present embodiment. Therefore, the detailed structure thereof is omitted. Herein, it is assumed, for the following description, that an actuating means, such as an electromagnetic solenoid or a hydraulic valve changing means, etc., is employed as the first actuator 23 for opening and closing the first opening/closing valve 22.

Further, an atmospheric air communicating channel 24, communicating with the atmospheric air, is provided in the second mold 17 more toward the first mold 15 side than the vacuuming flow channel 20. The second opening/closing valve 25 for opening and closing the atmospheric air communicating channel 24 is provided therein. Also, the third opening/closing valve 26, for opening and closing the film-forming space X, is provided between the atmospheric air communicating channel 24 and the vacuuming flow channel 20. With respect to the second and third opening/closing valves 25, 26, it is assumed in the following description that, as in the first opening/closing valve 22, the second and third actuators 27, 28 are employed as operating means, such as an electromagnetic solenoid or a pilot valve changing means, to carry out the opening and closing operations of the second and third opening and closing valves 25, 26. In addition, a masking portion 17b, for masking the peripheral edge portion of the work 16, is formed, as shown in FIG. 6(B), in the second mold 17.

Reference number 29 denotes a control portion that could be any one of various types of devices, such as a microcomputer, etc. The control portion 29 outputs control commands, which will be described later, to the respective actuators 20, 23, 27, 28. Various detection signals are inputted into the control portion 29, which come from a work incorporation detection sensor 30 for detecting whether a work 16 is incorporated in the first mold 15, a mold status detection sensor 31 for detecting whether the second mold 17 is located at a mold-matched position or at a mold-opened position with respect to the first mold 15, the first through third opening/closing detection sensors 32, 33, 34 for respectively detecting opening and closing of the first through third opening/closing valves 23, 27, 28, and a film-forming condition accomplishment detection sensor 35 for detecting whether the film-forming space X meets the film-forming conditions (the film-forming situations).

Herein, for example, if a series of molding processes carry out molding and film formation with respect to the work 16 as in the first embodiment, the work incorporation detection sensor 30 recognizes whether the molding process is carried out, and detects incorporation based on a judgment that the molding process has been carried out. Further, where a separately film-formed work 16 is incorporated in the first mold 15, or a masking member is incorporated in a work 16 molded by molding, a sensor may be directly provided in the first mold 15 in order to directly detect the work 16 incorporated in the first mold 15. However, such a mode may also be available in which an apparatus for incorporating a work or a masking member is composed of, for example, a robot (not illustrated) including an incorporation arm, and a detection sensor for detecting the presence or absence of a work 16 is provided in the corresponding incorporation arm, wherein it is detected whether the work 16 is incorporated in the first mold 15.

In addition, the mold status detection sensor 31 may be embodied as, for example, a detection sensor (two-point position detection sensor) for detecting whether the first mold 15 is located at a mold-matched position or a mold-opened position. However, respective exclusive sensors for separately detecting these positions may be used.

Further, the opening/closing detection sensors 32, 33, 34 may be embodied by using sensors for detecting whether the corresponding operation actuators 23, 27, 28 are turned on or off. Still further, the film-forming condition accomplishment detection sensor 35 judges whether the film-forming space X reaches a vacuum state necessary for film formation. The sensor 35 may be carried out by using a barometer (capable of detecting the degree of vacuum) disposed, for example, in the vacuuming flow channel 21 (either at the vacuum pump P side or at the film-forming space X side with respect to the first opening/closing valve 22) or a tubing channel 21a extending between the vacuum pump P and the vacuuming flow channel 21. Also, in the embodiment, it is assumed that the vacuum pump P always operates by means of a switch-on. However, it is a matter of course that the vacuum pump P may be controlled so as to be driven, for example, only in the film formation controlling process.

Figure 7:
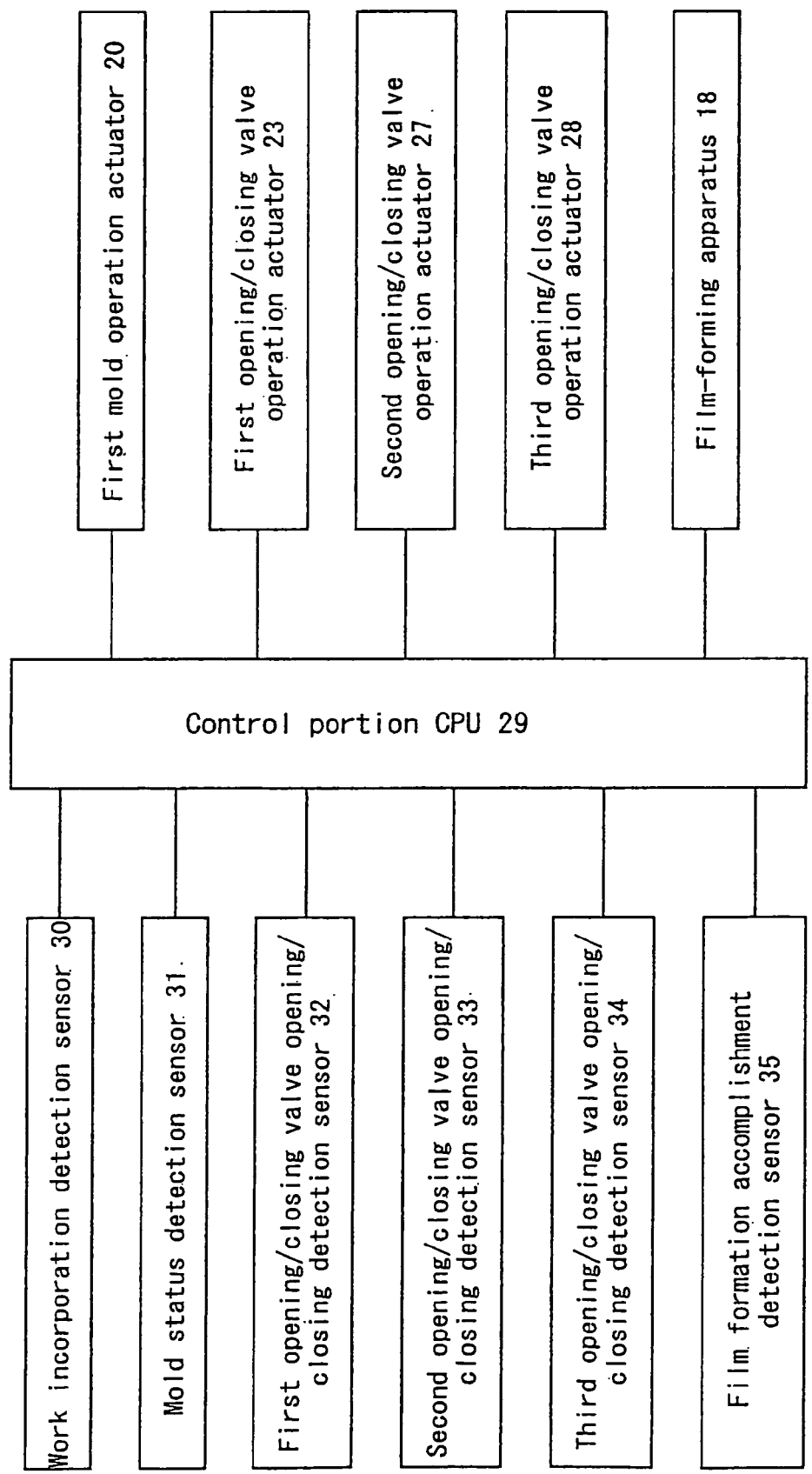
FIG. 7 is a block circuit diagram showing a controlled state according to the second embodiment.
Figure 8:
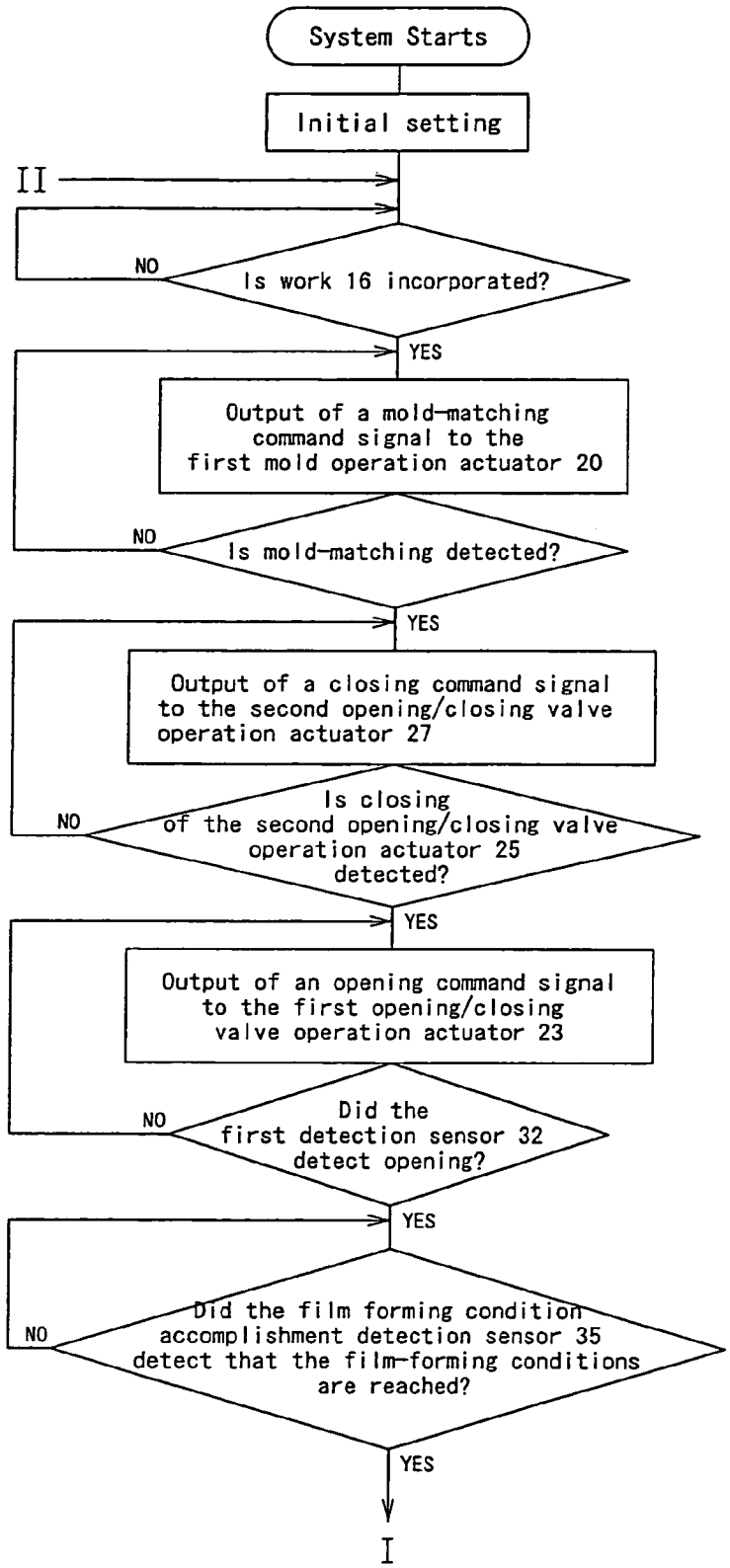
FIG. 8 is a flowchart showing a part of the control process according to the second embodiment.
Figure 9:
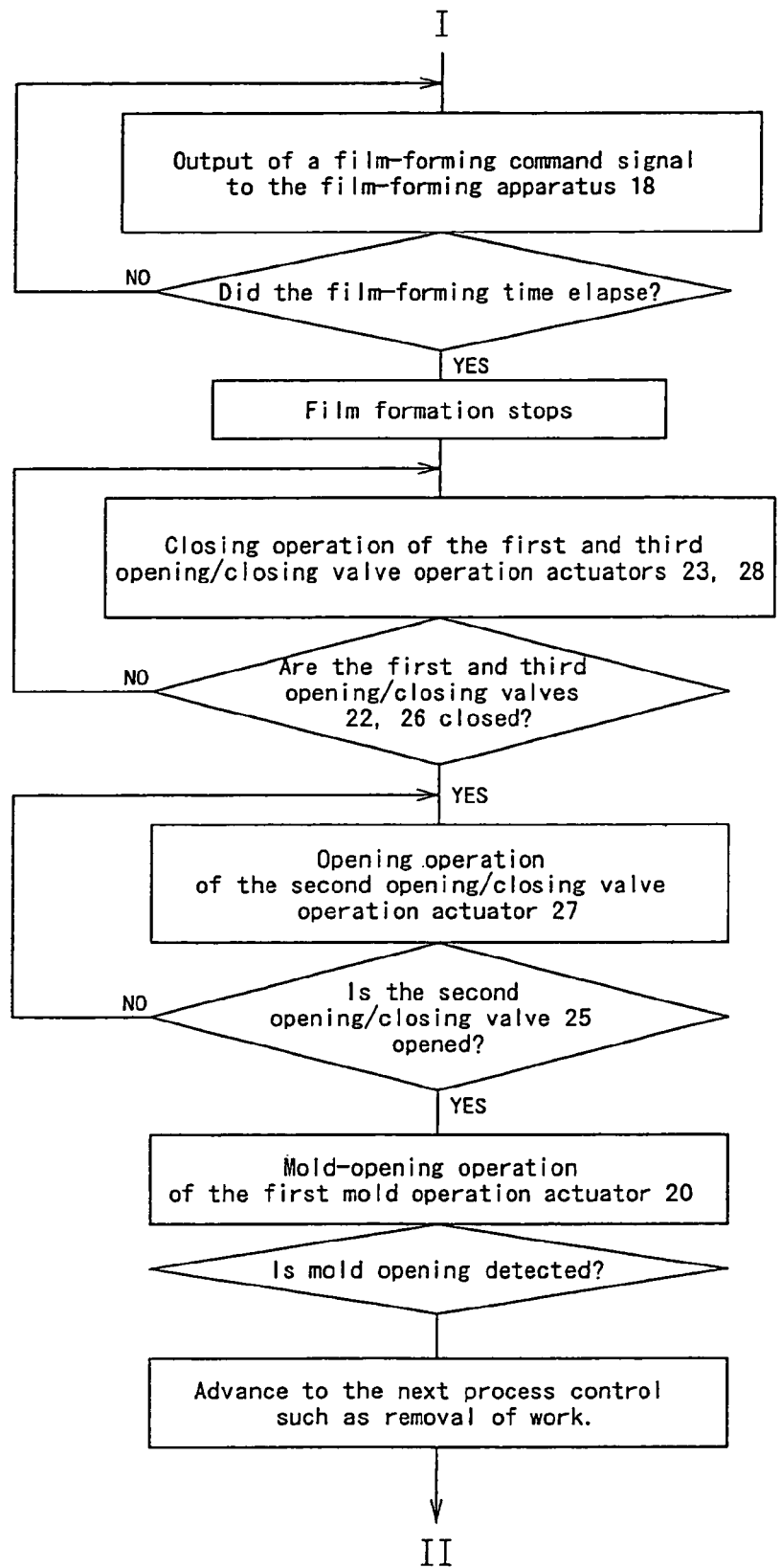
FIG. 9 is a flow chart showing the first remaining processes in the control process according to the second embodiment.
Figure 10:
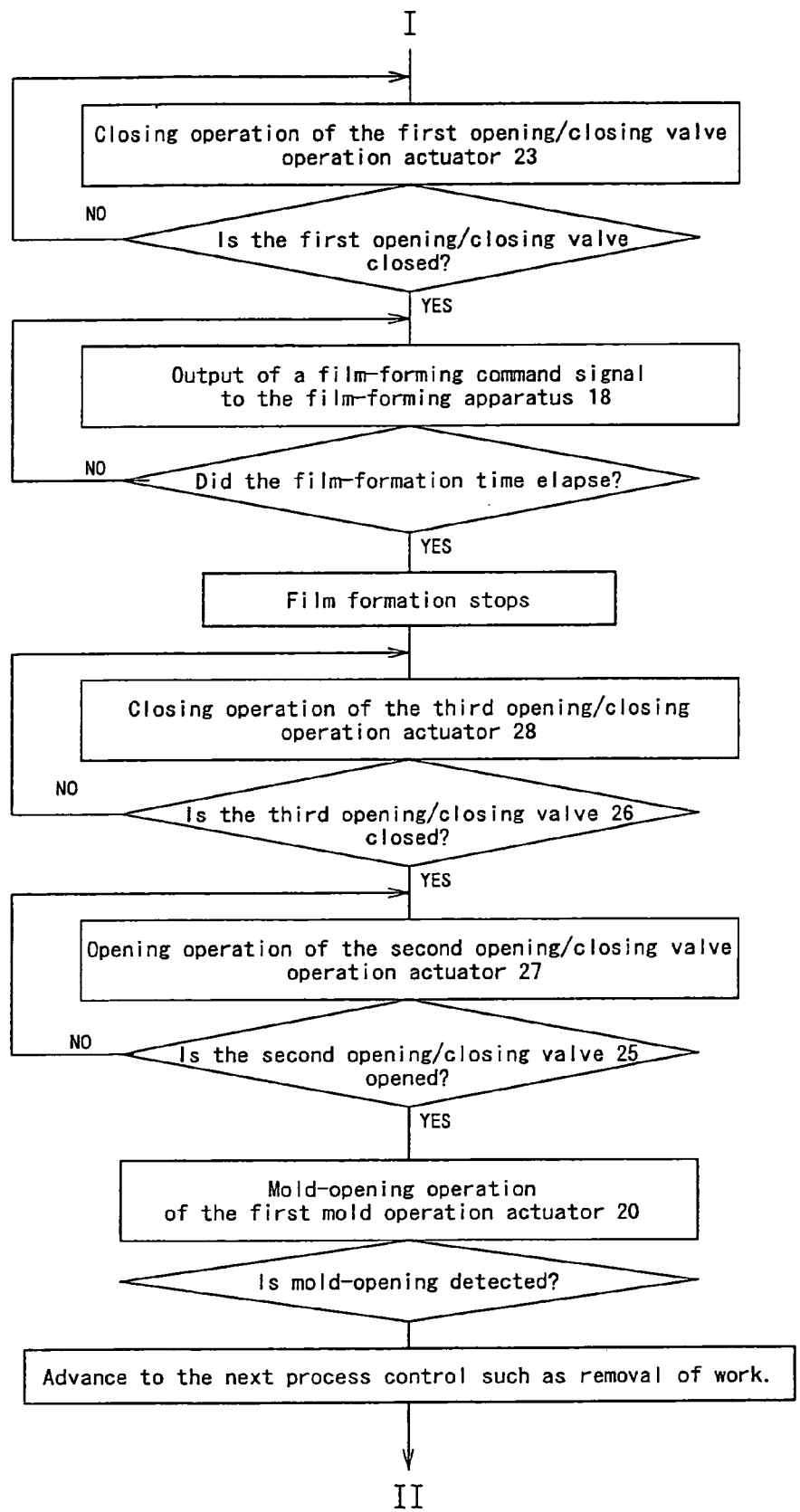
FIG. 10 is a flow chart showing the second remaining processes in the control process according to the second embodiment.

Next, with respect to the film formation controlling process by means of the control portion 29, a description is given of the second embodiment using the block circuit diagram shown in FIG. 7 and the flowcharts of FIGS. 8 through 10. In the drawings, with respect to the control portion 29, the initial setting for the beginning operation is carried out, in which power is switched on, the system is started, necessary data are read, and actuators are set to the initial state. In the initial state in the present embodiment, it is assumed that initial control is carried out, by which the first mold operating actuator 20 is set to a mold-opened state, the first and the third opening/closing valve operation actuators 23, 28 are set to a closed state, and the second opening/closing valve operation actuator 27 is set to an open state.

And, in the film formation controlling process, first, the control portion 29 carries out judgment whether a work 16 is incorporated in the first mold 15, based on a detection signal from the work incorporation detection sensor 30. Where the control portion 29 judges that the work 16 is incorporated, the control portion 29 outputs a control command to the first mold operation actuator 20 for a mold-matching operation, and when the mold status detection sensor 31 detects that the first mold 15 is positioned at a mold-matched position, the control portion 29 outputs a closing control command to the second opening/closing valve actuator 27. Corresponding thereto, the second opening/closing valve opening/closing detection sensor 33 inputs a closing signal of the second opening/closing valve 25. Thereafter, the control portion 29 outputs an opening control command to the first and the third opening/closing valve operation actuators 23, 28, thereby causing the film-forming space X to communicate with the vacuum pump P and to create a vacuum in the film-forming space X. Then, the film-forming condition accomplishment detection sensor 35 detects whether the film-forming space X is a vacuum.

In addition, output of the closing control command to the second opening/closing valve actuator 27 may be issued prior to the mold-matching process. However, if the output is issued after the mold-matching process, as in the present embodiment, the pressure in the film-forming space X, sealed in the mold-matching process, can be brought into an atmospheric state. Thus, there is an advantage in that it is possible to prevent the time required for creating a vacuum in the vacuuming process from being lengthened. That is, if the mold matching is further intensively carried out in an almost sealed state in the final state of mold matching, the cubic volume of the film-forming space X is made smaller. As a result, the pressure in the film-forming space X is made higher than the atmospheric pressure, as in the case where the valve is closed prior to the mold-matching process.

FIGS. 9 and 10 shows control procedures for two control modes after the film formation conditions are reached. First, in the embodiment shown in FIG. 9, a control command of film-forming operation is outputted to the film-forming apparatus 18, wherein a film formation operation is carried out. The film-forming process is carried out for the period of a film-forming time preset as the time of completion of film formation, and is controlled to stop. After that, a closing operation command is outputted to the first and the third opening/closing valve actuators 23, 28. When it is detected by the respective corresponding first and third opening/closing detection sensors 32, 34 that the first and the third opening/closing valves 22, 26 are closed, an opening operation command is outputted to the second opening/closing operation actuator 27. When it is detected by the second opening/closing detection sensor 33 that the corresponding second opening/closing valve 25 is opened, a control command for a mold-opening operation is outputted to the first mold operation actuator 20. When the mold opening is detected by the mold status detection sensor 31, the series of film-forming processes is terminated, wherein a removal process of the work 16 on which a film and further mold-molding processes as in the first embodiment are commenced. After these processes are completed, the status is controlled so that the initial control state in which the above-described initial settings are terminated is reset.

By employing such a mode thus controlled, it is possible to continuously form a film on the work 16 through a series of control processes by using the molds 15, 17. Further, the film-forming work can be simplified by achievement in which the process is repeatedly executed. And, because, in the embodiment, the first and the third opening/closing valves 22, 26 are closed in the process prior to the mold-opening process, and the second opening/closing valve 25 is opened in the mold-opening process, atmospheric air flows into the film-forming space X at the work side between the third opening/ closing valve 26 and the work 16 for which the mold is opened. As a result, the film-forming space X is brought to atmospheric pressure while the film-forming space X at the film-forming apparatus 18 side between the film-forming apparatus 18 and the third opening/closing valve 26 is maintained in a vacuum state. Accordingly, when mold opening, it is not necessary to carry out a forced mold opening operation in a vacuum state as in the first embodiment, wherein the molds are smoothly and gently opened under the atmospheric pressure.

Further, because the film-forming space X at the film-forming apparatus side, between the film-forming apparatus 18 and the third opening/closing valve 26, is maintained in a vacuum state when the molds are opened, the reduced air in the film-forming space X at the work side between the third opening/closing valve 26 and the work 16 makes it easier to secure a vacuum state when carrying out the next film-forming operation. Therefore, there is an advantage in that the vacuuming process to bring the entire film-forming space X into the film-forming conditions can be carried out in a short time and work efficiency can be improved.

Where the present second embodiment is as described above, the film-forming space X at the film-forming apparatus 18 side is closed by the third opening/closing valve 26 at least from the mold-opening process to the mold-matching process, the first opening/closing valve 22 may no longer be necessary. However, at the stage of commencing the operation, if the vacuum pump P is actuated in advance in a state where the first opening/closing valve 22 is closed in the stage to the mold matching, the flow channel from the first opening/closing valve 22 to the vacuum pump P can be made a vacuum in advance. Thus, because the vacuuming flow channel 21 located at the film-forming space X side with respect to the first opening/closing valve 22 and the corresponding film-forming space X are only made a vacuum in the vacuuming process, the vacuuming process can be carried out in a shorter time. After the beginning film-forming process is completed, control can be carried out with the first opening/closing valve 22 opened.

Next, the embodiment shown in FIG. 10 differs from the above-described embodiment in that the first opening/closing valve 22 is controlled to be closed in the process prior to the film-forming process. Thereby, because the first opening/closing valve 22 is closed in the film-forming process, the film-forming space X is not influenced by the pulsation generated by an absorption operation of the vacuum pump P, and film formation is carried out in a still state, wherein there is an advantage in that a more uniform and accurate film formation can be achieved.

Figure 11:
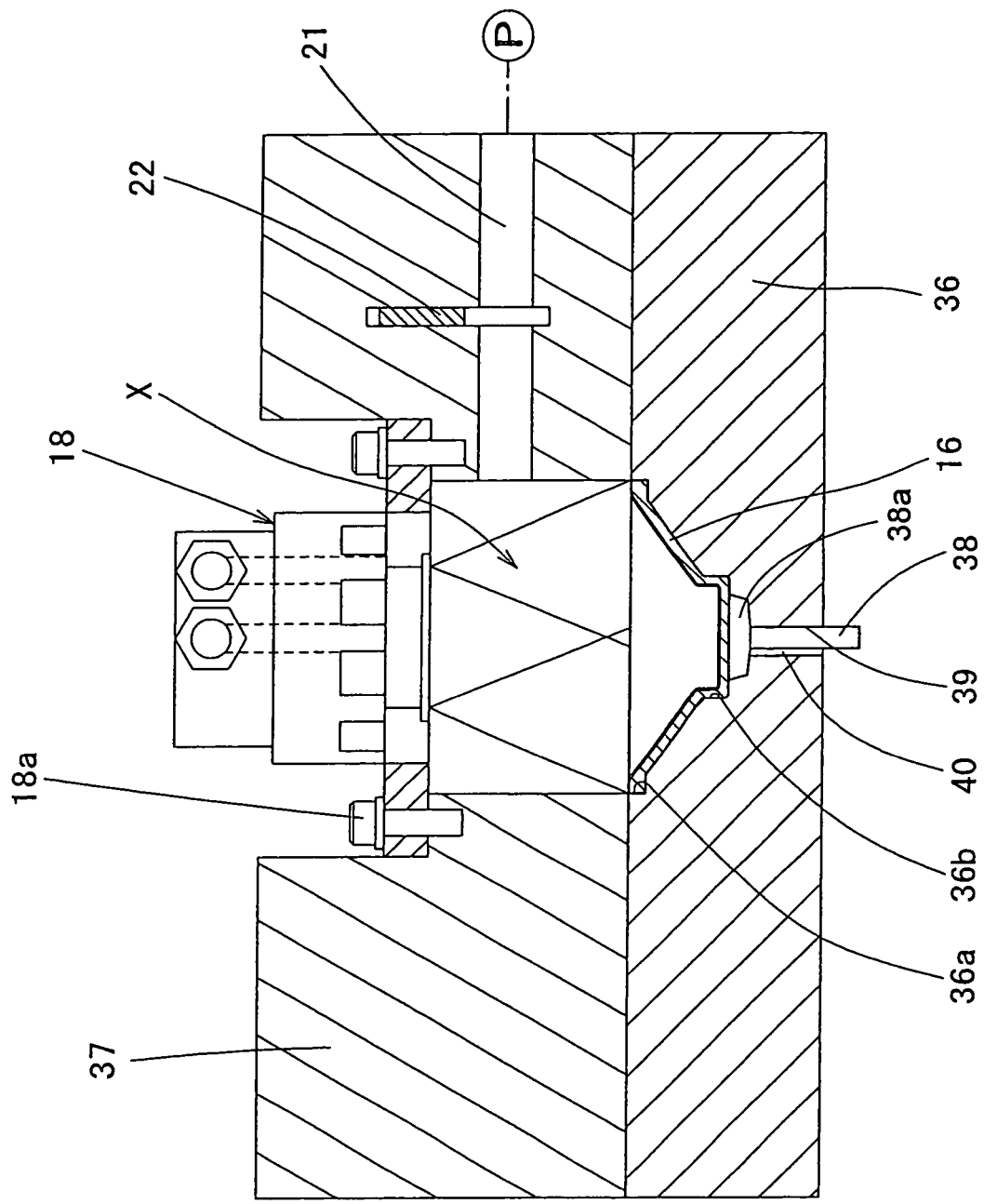
FIG. 11 is a schematic, cross-sectional view of a mold-matched mold portion according to a third embodiment.
Figure 12:
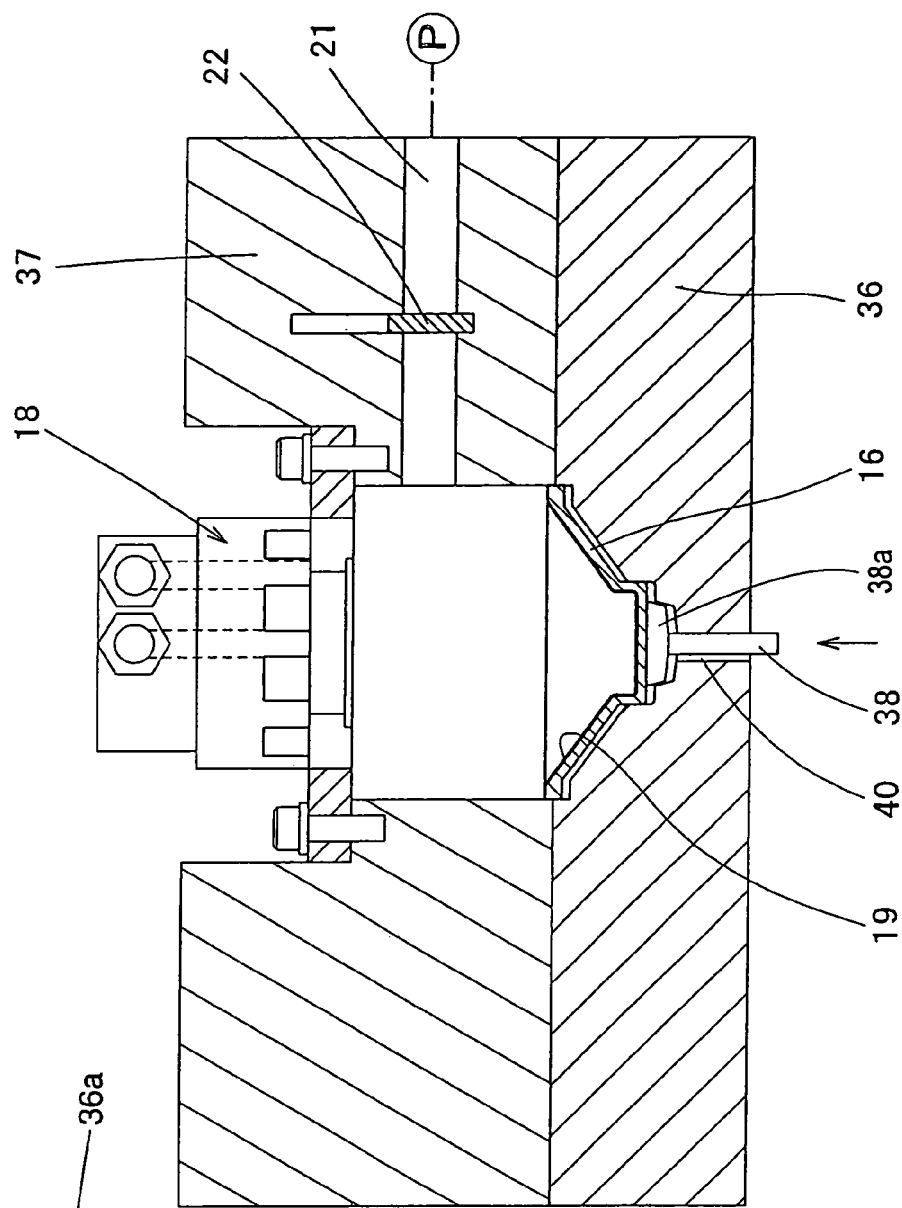
FIG. 12(A) is a schematic, cross-sectional view showing a mold portion in a half-removed state of a work according to the third embodiment.
FIG. 12(B) is an enlarged sectional view showing a vertical facial region of a mold.
Figure 12:
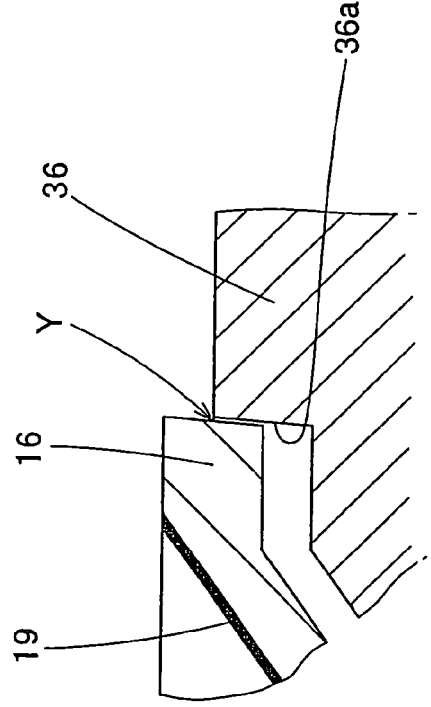

In addition, the invention may be embodied without the third opening/closing valve 26 as in a third embodiment, shown in FIGS. 11 and 12. In this case, because atmospheric air flows into the entire film-forming space X in the mold opening process, the third embodiment is slightly inferior to the second embodiment in that the time required to reach the film-forming conditions (to reach a vacuum state) is lengthened in the vacuuming process. However, this does not constitute a problem in which the film-forming space X is small.

The above-described third embodiment is provided with the first mold 36 and the second mold 37 and differs from the second embodiment in that neither masking portion for masking the peripheral portion of the work 16 nor the third opening/closing valve 26 are provided in the second mold 37. In the third embodiment, the first mold 36 is provided with an ejector body (ejector means) 38, whose depiction and description is omitted in the first mold and the second mold, wherein prior to the mold opening or simultaneously therewith after the film-forming process, the ejector body 38 is caused to protrude from the mold surface and causes the work 16 to be removed from the first mold 36. However, an atmospheric air inflow channel 40 is formed in an insertion channel 39 through which the ejector body 38 can be retracted and seated. In this case, in a state where the ejector body 38 is retracted and the molds are not released, the atmospheric air inflow channel 40 is closed by a tip end portion 38a (corresponding to a second opening/closing means) of the ejector body 38 to stop atmospheric air flow into the film-forming space X (FIGS. 11 and 12(A)). However, as soon as the ejector body 38 is unseated and moved to a provisional removing posture for the work 16 from the molds, the atmospheric air inflow channel 40 is opened to permit atmospheric air to flow into the vacuumed film-forming space X. Also, the ejector body 38 may completely remove the work 16 from the molds. However, in this case, because the work 16 is freed from the first mold 16, there is a problem in that, when opening the molds, the work 16 is dropped from the first mold 36. Therefore, the work 16 is half removed from the first mold 36, that is, it is in a provisionally supported state where a part of the work 16 is left in the first mold 36 before it is completely removed from the mold, that is, in a half-removed state; whereby there is an advantage in that the work 16 can be prevented from dropping when opening the mold. In the mode according to the embodiment, it is possible to carry out the half-removing operation and a full-removing operation when taking the work 16 out of the mold.

In this connection, where the first mold 36 is provided with vertical mold surfaces 36a, 36b that support the work 16, it is common in the field of mold formation that a slightly tapered section (taper for removal) which is widened toward the open end of the mold so that the work 16 can be easily removed is formed on the substantially vertical mold surfaces 36a, 36b (FIG. 12(B)). And, in this case, such an advantage is brought about by means of a slight clearance Y which is produced between the tapered section and the work 16 and functions as an atmospheric air inflow channel, and inflow of atmospheric air can be achieved. In addition, it is not necessarily required that the pressure in the film-forming space X is set to the atmospheric pressure when opening the mold, wherein it is a matter of course that, if the pressure permits atmospheric air to flow in and the internal pressure is lower than the atmospheric air pressure, this contributes to a lightening in operation load for opening the mold.

And, in such a mode, it is not necessary that an exclusive atmospheric air inflow channel and the second opening/closing valve are provided as in the second embodiment. Such an advantage is brought about, by which inflow of atmospheric air can be controlled by effectively using the ejector body 38 and the inflow channel 40 provided to bring in and retract the ejector body 38. This is convenient.

Figure 13:
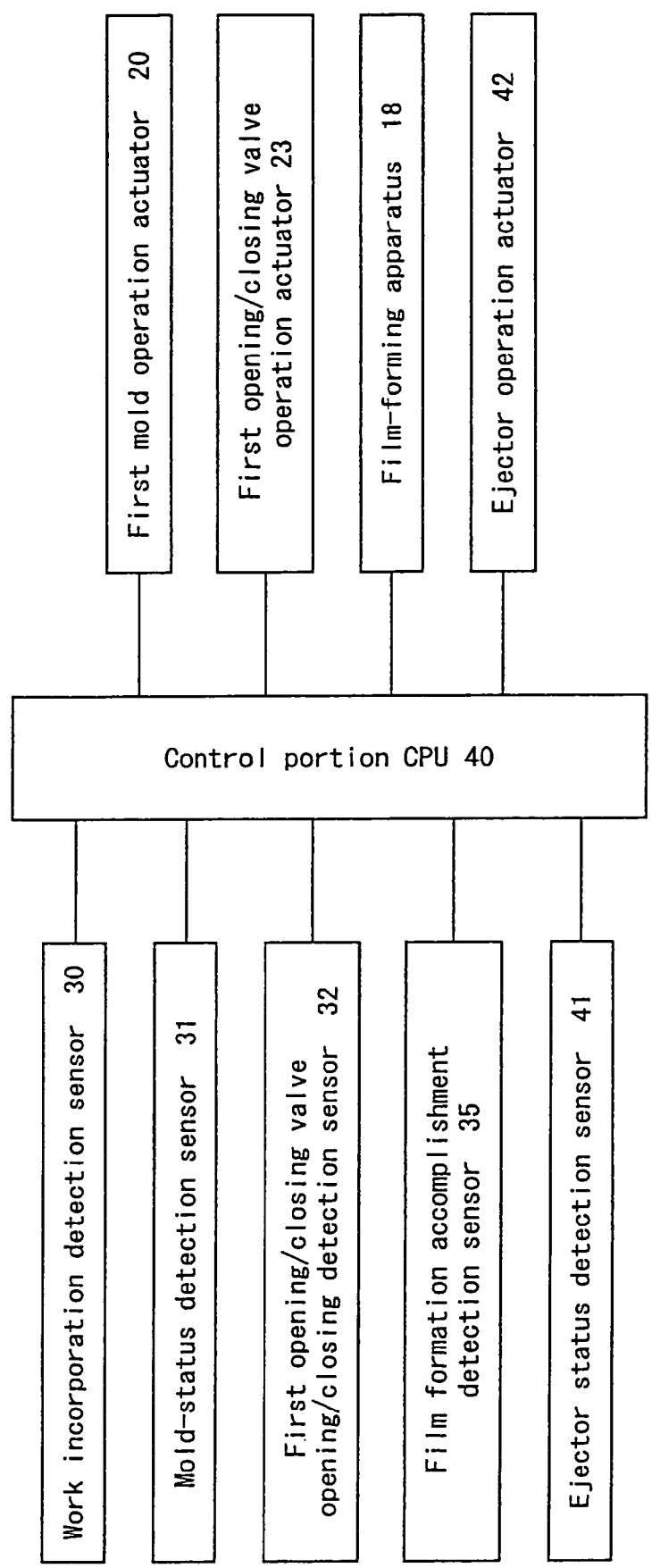
FIG. 13 is a block circuit diagram showing a controlled state according to the third embodiment.
Figure 14:
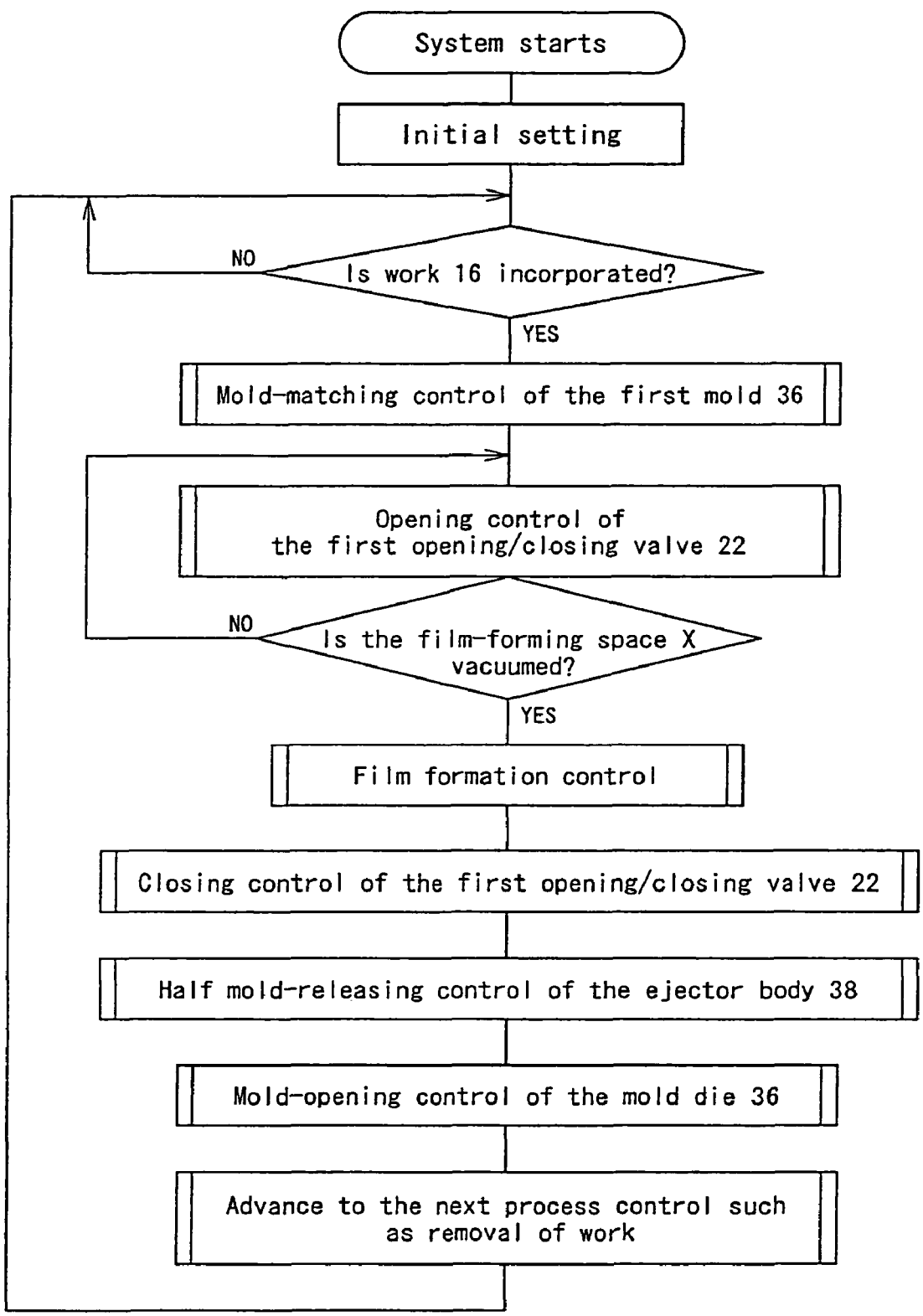
FIG. 14 is a flow chart showing the control process according to the third embodiment.

Herein, FIGS. 13 and 14 depict a block circuit diagram and a flowchart, respectively, for a case where the ejector body 38 is employed. In this mode, inputted into the control portion 40 are detection signals outputted from the ejector posture detection sensor 41 for detecting the status of the ejector body 38 in addition to the same work incorporation detection sensor 30, mold status detection sensor 31, first opening/closing valve opening/closing detection sensor 32, and film-forming condition accomplishment detection sensor 35 as of the second embodiment. On the other hand, the control portion 40 outputs a control command to the ejector operation actuator 42 in addition to the first mold operation actuator 20, the first opening/closing valve operation actuator 23, and the film-forming apparatus 18.

Herein, the ejector posture detection sensor 41 may be of a type that is capable of detecting movement by which the ejector 38 is unseated and retracted. However, the ejector posture detecting sensor 41 may be embodied as a type capable of judging the status by reading a control signal outputted to the operation actuator 42 of the ejector body 38.

In FIG. 14, when the system is started and initial setting is commenced, a signal whether the work 16 is incorporated is inputted by the work incorporation detection sensor 30, and when a detection signal that the work 16 is incorporated is inputted in the control portion 40, the control portion 40 outputs a mold matching control command to the first mold operation actuator 20. Simultaneously, the mold status detection sensor 31 judges whether the first mold 36 is in a mold-matched state, by which mold-matching control of the first mold 36 is carried out. When it is judged that the first mold 36 is matched, an opening command signal is outputted to the first opening/closing operation actuator 23. A detection signal that the first opening/closing valve 22 has been opened is inputted into the control portion 40 by the first opening/closing detection sensor 32, and at the same time, the film-forming condition accomplishment detection sensor 35 judges whether the film-forming space X is in a vacuum state, that is, the film-forming conditions are reached.

When it is judged that the film-forming conditions are reached, a command of film-forming control is outputted to the film-forming apparatus 18 during the predetermined period of film-forming time, and film-forming control for stopping the film formation is executed in line with elapse of the corresponding period of time. After that, a closing command signal is outputted to the first opening/closing valve operation actuator 23, wherein closing control is executed for the first opening/closing valve 22 in which a detection signal that the corresponding first opening/closing valve 22 has been closed is inputted from the first opening/closing detection sensor 32.

Thus, after a film is formed on the work 16 and the first opening/closing valve 22 is entered into a closed state, a control command by which the ejector operation actuator 42 is caused to be entered into a half removing posture is outputted, and when a detection signal detected by the ejector posture detection sensor 41 is inputted to recognize that atmospheric air has flown into the film-forming space X, a mold opening command is outputted to the first mold operation actuator 20 to execute the corresponding mold opening operation, wherein the series of film-forming processes are finished by the mold opening being detected by the mold status detection sensor 31.

Further, the next process control, such as a process for removing the work 16 from the first mold and taking it out by protruding the ejector body 38, is carried out. In this connection, where the next process operation is to take out the work 16, a taking-out robot is applied to the work 16 which has been half-removed, and the ejector body 38 is further protruded in this state to bring the work 16 in a fully removing posture thereof, wherein the taking-out robot catches the work 16 and removes it from the mold. Thus, it becomes possible to prevent the work 16 from dropping from the first mold 36.

In the third embodiment thus embodied, because atmospheric air can flow into the vacuumed film-forming space X by effectively using the ejector body 38, which is provided to take out the film-formed work 16, and the inflow channel 40 thereof, the advantage the mold structure can be simplified is achieved.

In such a mode, there is an advantage in that the ejector means can be effectively used for the atmospheric air inflow channel and the opening/closing means thereof. However, it is a matter of course that the atmospheric air inflow channel and the opening/closing means may be formed in the first mold.

Described above is a useful and effective film-forming mold for a various types of moldings (work) including headlamps, direction indicators (including side blinkers), tail lamps, etc., which are incorporated in a vehicle, etc., a film-forming method using the corresponding mold, and a film formation controlling system.

What is claimed is:

1. A molding and film-forming mold comprising:
   a first mold that includes a first mold surface for forming one surface of a first work and a second mold surface for forming one surface of a second work;
   a second mold that includes a first mold surface for forming another surface of the first work and a second mold surface for forming another surface of the second work, wherein:
   the second mold includes a third mold surface within which film-forming means is incorporated in order to form a film on the another surface of the first work that is supported by the first mold, and
   the first mold surface of the first mold supports the first work and the second mold surface of the second mold supports the second work when the first work and the second work are matched to each other after the film is formed on the another surface of the first work.

2. The molding and film-forming mold according to claim 1, wherein the first mold is a movable type mold and the second mold is a fixed type mold.

3. The molding and film-forming mold according to claim 1, wherein the film-forming means is one of a spattering apparatus and a vacuum deposition apparatus.

4. The molding and film-forming mold according to claim 1, wherein the film-forming means is provided in a cylindrical recessed hole having a bottom, which is formed in the second mold, and a film-forming space is secured between the film-forming means and the first work.

5. The molding and film-forming mold according to claim 1, wherein the film-forming means is provided so as to airtightly seal a through-hole provided in the second mold, and a film-forming space is secured between the film-forming means and the first work.

6. The molding and film-forming mold according to claim 5, wherein the second mold is provided with a vacuuming flow channel to make the film-forming space a vacuum, and first opening/closing means for opening and closing the vacuuming flow channel.

7. The molding and film-forming mold according to claim 1, wherein a masking portion for masking the first work attached to the first mold is provided in the second mold.

8. The molding and film-forming mold according to claim 5, wherein one of the first mold and the second mold is provided with an atmospheric air inlet channel for permitting atmospheric air to flow into the film-forming space, and second opening/closing means for opening and closing the atmospheric air inlet channel.

9. The molding and film-forming mold according to claim 8, wherein the atmospheric air inlet channel and the second opening/closing means are provided in ejector means for removing a film-formed work from the first mold.

10. The molding and film-forming mold according to claim 8, wherein the second mold is provided with third opening/closing means for opening and closing the film-forming space, which is positioned between the vacuuming flow channel and the atmospheric air flow inlet channel.

11. A molding and film-forming method using a mold, comprising, at least, the sequential steps of:
- work molding of a molded first work and a molded second work by matching a first mold surface of a first mold and a first mold surface of a second mold and by matching a second mold surface of the first mold and a second mold surface of the second mold;
- work removing such that the molded first work is left on the first mold surface of the first mold while the molded first work is removed from the first mold surface of the second mold, and the molded second work is left on the second mold surface of the second mold while the molded second work is removed from the second mold surface of the first mold;
- mold matching the first mold surface of the first mold onto which the molded first work is left and a third mold surface of the second mold within which film-forming means to form a film on the molded first work is incorporated, the third mold surface of the second mold being different than the first mold surface and the second mold surface of the second mold;
- film-forming for forming the film on the molded first work in a state of the mold matching;
- opening the first mold and the second mold; and
- work adhering of the molded first work with the formed film and the molded second work by matching the first mold surface of the first mold and the second mold surface of the second mold in a state where the molded first work is left on the first mold surface of the first mold and the molded second work is left on the second mold surface of the second mold.

12. The molding and film-forming method using a mold, according to claim 11, wherein the first mold is a movable type and the second mold is a fixed type.

13. The molding and film-forming method using a mold, according to claim 11, wherein the film-forming means is one of a spattering apparatus and a vacuum deposition apparatus.

14. The molding and film-forming method using a mold, according to claim 11, wherein a vacuuming step to create a vacuum in a film-forming space between the film-forming means and the molded first work is provided between the mold matching step and the film-forming step.

15. The molding and film-forming method using a mold, according to claim 14, wherein the second mold is provided with a vacuuming flow channel communicating with a vacuum pump to create the vacuum in the film-forming space, and first opening/closing means for opening and closing the vacuuming flow channel, and the vacuuming step is carried out by opening the first opening/closing means.

16. The molding and film-forming method using a mold, according to claim 11, wherein the second mold is provided with a masking portion for masking the molded first work attached to the first mold, and the molded first work is masked in the mold matching step.

17. The molding and film-forming method using a mold, according to claim 14, wherein one of the first mold and the second mold is provided with an atmospheric air inflow channel for permitting atmospheric air to flow into the film-forming space, and second opening/closing means for opening and closing the atmospheric air inflow channel, and further comprising a first opening/closing means closing step for closing the first opening/closing means and a second opening/closing means opening step for opening the second opening/closing means between the film-forming step and the opening step.

18. The molding and film-forming method using a mold, according to claim 17, wherein the atmospheric air inflow channel and the second opening/closing means are provided in ejector means for removing a film-formed work from the first mold, and the second opening/closing means opening step is carried out in line with removal of the work by the ejector means.

19. The molding and film-forming method using a mold, according to claim 17, wherein the atmospheric air inflow channel is a mold-matching surface between the first mold and the second mold, and the second opening/closing means closes the atmospheric air inflow channel by mold matching in the mold matching step, and opens the atmospheric air inflow channel in the opening step.

20. The molding and film-forming method using a mold, according to claim 17, wherein the second mold is provided with third opening/closing means for opening and closing the film-forming space between the vacuuming flow channel and the second opening/closing means, and a third opening/closing means closing step for closing the third opening/closing means is provided during the steps from an end of the film-forming step to the second opening/closing means opening step.

* * * * *